(12) United States Patent
Akram et al.

(10) Patent No.: US 8,389,920 B2
(45) Date of Patent: Mar. 5, 2013

(54) METHOD AND APPARATUS FOR BREAKING SURFACE TENSION DURING A RECESSED COLOR FILTER ARRAY PROCESS

(75) Inventors: Salman Akram, Boise, ID (US); James Chapman, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 1392 days.

(21) Appl. No.: 12/047,960

(22) Filed: Mar. 13, 2008

(65) Prior Publication Data

US 2009/0231475 A1 Sep. 17, 2009

(51) Int. Cl.
*H01L 27/00* (2006.01)

(52) U.S. Cl. .......... 250/208.1; 250/214.1; 250/226; 257/294; 257/432; 348/273

(58) Field of Classification Search .......... 250/208.1, 250/214.1, 216, 226; 257/294, 432, E27.111, 257/E27.135; 348/273, 274, 276, 340
See application file for complete search history.

(56) References Cited

U.S. PATENT DOCUMENTS

| | | | |
|---|---|---|---|
| 5,677,202 | A | 10/1997 | Hawkins et al. |
| 6,864,022 | B2 | 3/2005 | Machiguchi et al. |
| 7,094,519 | B2 | 8/2006 | Jung |
| 2002/0197753 | A1 | 12/2002 | Yeh et al. |
| 2006/0141647 | A1 | 6/2006 | Kim |
| 2006/0261385 | A1 | 11/2006 | Li et al. |
| 2006/0267121 | A1 | 11/2006 | Li |
| 2006/0289912 | A1 | 12/2006 | Sik |
| 2007/0042278 | A1 | 2/2007 | Hodge et al. |
| 2007/0045515 | A1 | 3/2007 | Farnworth et al. |
| 2007/0125935 | A1 | 6/2007 | Yaung |
| 2007/0126898 | A1 | 6/2007 | Feldman et al. |
| 2007/0126913 | A1 | 6/2007 | Kang |
| 2007/0145608 | A1 | 6/2007 | Kim |
| 2007/0148806 | A1 | 6/2007 | Kim |
| 2007/0148976 | A1 | 6/2007 | Jeong |
| 2007/0152139 | A1 | 7/2007 | Moores |
| 2007/0152251 | A1 | 7/2007 | Park |
| 2007/0153107 | A1 | 7/2007 | Boettiger et al. |
| 2007/0153337 | A1 | 7/2007 | Kim |
| 2008/0198248 | A1* | 8/2008 | Liu ............................ 348/273 |

FOREIGN PATENT DOCUMENTS

| | | |
|---|---|---|
| JP | 4044266 | 2/1992 |
| JP | 2005-173325 | 6/2005 |
| JP | 2005-271476 | 10/2005 |
| JP | 2006-332602 | 12/2006 |
| KR | 10-2004-0030247 | 4/2004 |
| KR | 10-2004-0058700 | 7/2004 |
| WO | WO-2007/002832 | 1/2007 |

OTHER PUBLICATIONS

A. El Gamal, et al. "CMOS Image Sensors", Circuits and Devices Magazine, IEEE, May-Jun. 2005, vol. 21, Issue 3, pp. 6-20.
M. Vrhel, et al. "Color Image Generation and Display Technologies", Signal Processing Magazine, IEEE, Jan. 2005, vol. 22, Issue 1, pp. 23-33.

* cited by examiner

*Primary Examiner* — Kevin Pyo

(57) ABSTRACT

A method of making a color filter array of an imaging device comprises forming a main recess for a color filter array, forming a tension breaking feature at an edge of the main recess, and providing a color filter array material across the tension breaking feature and main recess as part of forming the color filter array. The tension breaking feature reduces the settling distance of the color filter array material. An imaging device having the thus formed color filter array is also described.

24 Claims, 24 Drawing Sheets

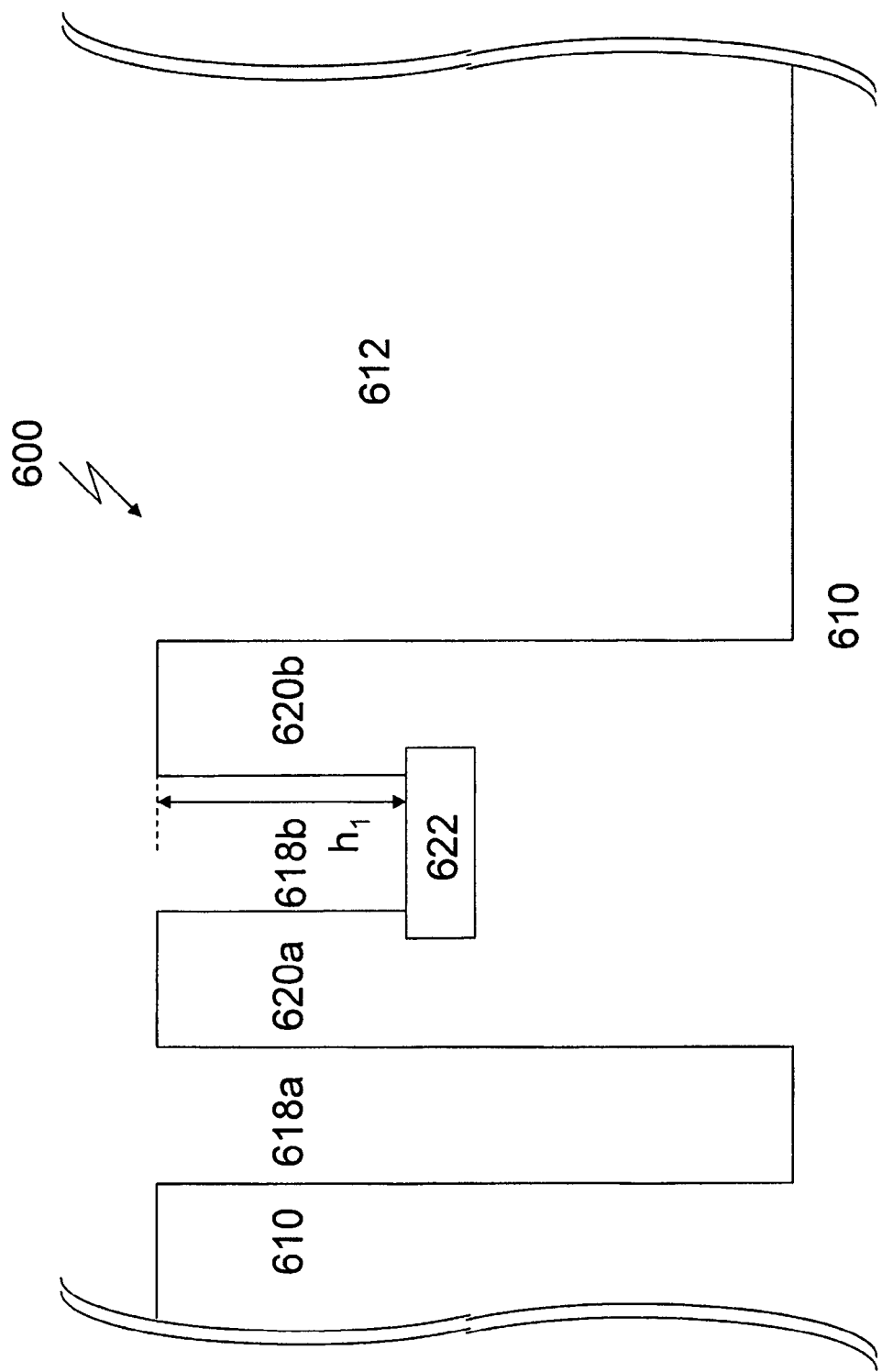

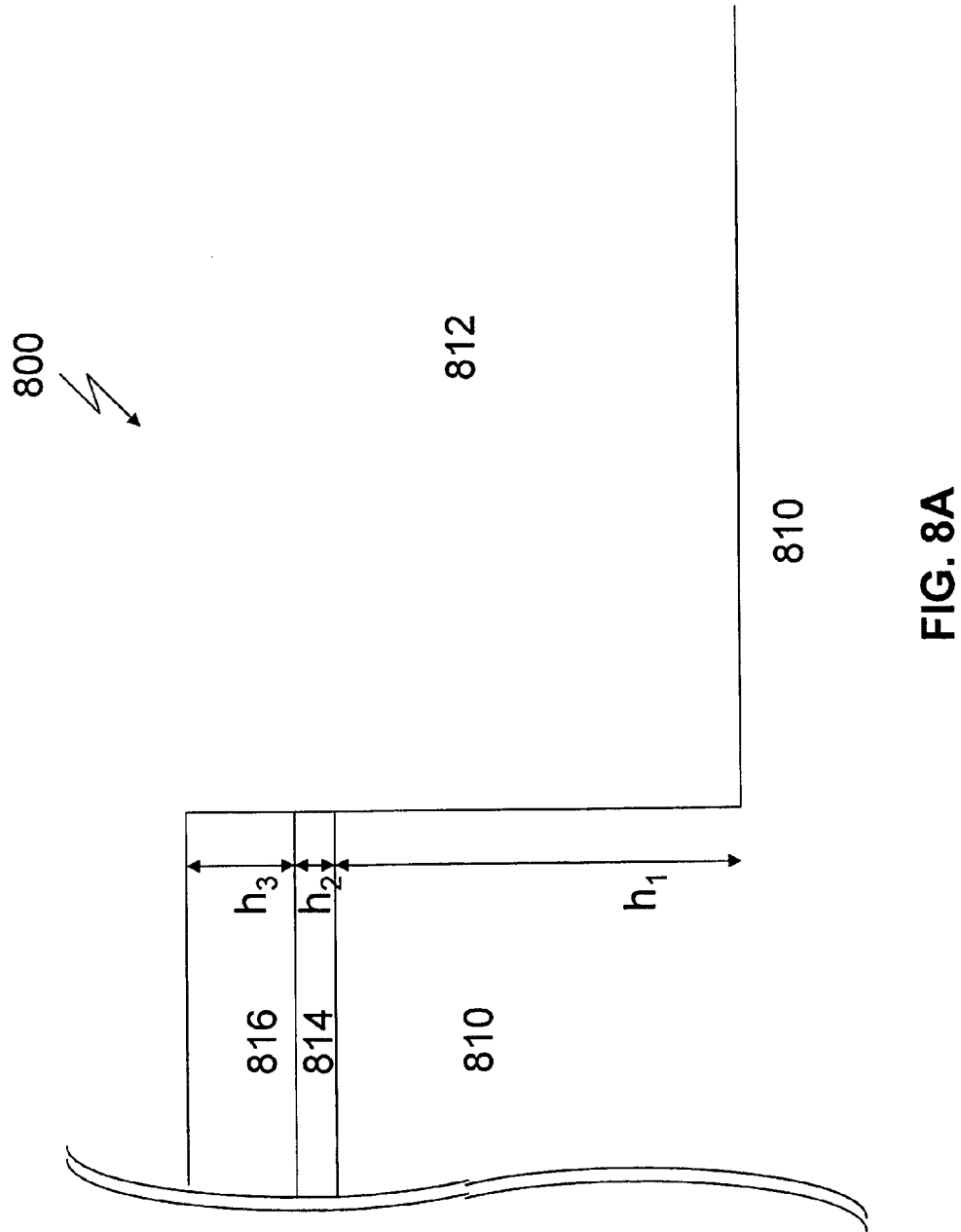

METHOD AND APPARATUS FOR BREAKING SURFACE TENSION DURING A RECESSED COLOR FILTER ARRAY PROCESS

FIELD OF THE INVENTION

Embodiments of the invention relate to imaging devices and methods of making color filter arrays for such devices.

BACKGROUND OF THE INVENTION

Solid state imaging devices include an array of pixel cells, which converts light energy into electrical signals. Each pixel cell contains a photosensor for converting a respective portion of a received image into an electrical signal. The electrical signals produced by the photosensors are processed to render a digital image.

Photosensors are sensitive to light in the visible spectrum and convert that light into a light intensity signal value. To capture color images, the spectral components of incident light must be separated and collected. To this end, a color filter array (CFA) is often associated with the pixel array. Color filters are imposed in front of the pixel cells and over the photosensors and are arranged in a predetermined pattern. The color filters of the color filter array are typically pigmented or dyed material that will only pass a narrow color band of visible light, e.g., red, blue, or green. A common example of a color filter array pattern is the tiled color filter array illustrated in U.S. Pat. No. 3,971,065, and commonly referred to as "the Bayer pattern" color filter. The color filter array allows what would otherwise be black and white image sensors to produce color images. Other color filter array patterns are also known.

As imaging devices are used in smaller and smaller applications, there is a need to decrease the stack height of the imaging array of the imaging device, requiring the use of a recessed color filter array. A recessed color filter array is formed in a recess of a substrate layer which is provided over photosensors. The recessed arrangement prevents the color filter array from extending above a desired pixel array stack height.

FIG. 1 shows a simplified, partial cross section of a recessed color filter array 14 in an imaging device 100. The imaging device 100 includes a substrate layer 10 having a recess 12 etched or otherwise formed therein. While FIG. 1 only shows a portion of a substrate layer 10 of a single imaging device 100, i.e., a single die, it should be understood that the processing steps may be and generally are performed on multiple dies of a wafer at the same time. A nitride layer 16, for example, silicon nitride ($Si_3N_4$), is formed on the surface of the substrate layer 10 including the recess 12.

The color filter array 14 generally has several different filter colors, such as red, green and blue, or cyan, magenta, yellow, and black, or other combination of filter colors arranged in a pattern. Filters of the same color are formed by a series of steps including coating a filter material, such as a colored polyimide, exposing it through a pattern mask, and developing the filter material into a pattern of filters of the desired color. For example, to form a Bayer pattern filter, a liquid green filter material is coated onto the substrate layer 10 including the recess 12 by a method such as spin coating. The green filter material is exposed, for example, to ultraviolet light through a mask and developed into a pattern of green color filters. The green color filters are then cured. The green filter material is developed into a pattern, for example, by using a solvent to remove portions of the green filter material that are not developed. The green filter material is then cured again. The coating, exposing, developing, and curing steps are repeated for the blue filter material to form blue filters and then again for red filter material to form red filters to complete the color filter array 14. Microlenses (not shown) to focus the light onto the photosensors may be formed on top of the color filter array 14.

As illustrated in FIG. 1, one problem associated with formation of a conventional recessed color filter array 14 is that the color filter array 14 may have a non-uniform thickness and may be thicker at the edges of the color filter array 14 than at the center. The majority portion of the color filter array 14 located away from the edge of the recess 12 is formed to a relatively uniform thickness d. The distance from the edge of the recess 12 to the portion of the color filter array 14 at the relatively uniform thickness d is known as the settling distance s. The portion of the color filter array 14 spanning the settling distance s slopes down from the edge of the recess 12 towards the portion of the color filter array 14 having the relatively uniform distance d.

This lack of uniformity in color filter array 14 thickness can cause problems in the imaging device 100, such as making the pixel output signals for underlying pixels associated with the edges of array 14 non-uniform and providing a poor foundation for the microlenses. In addition, an uneven thickness of color filter array 14 can cause imaging efficiency reduction by creating additional fixed pattern noise or shading effects. Specifically, fixed pattern noise, which is a spatial variation in pixel output values under uniform illumination, results from the variation of color filter material. An undesirable shading effect occurs as the result of non-planarity of the color filter array over the entire surface of the array. Thus, having a color filter array 14 with a more uniform thickness can advantageously help to create a solid foundation for microlenses, reduce fixed pattern noise, and decrease undesirable noise shading.

BRIEF DESCRIPTION OF THE DRAWINGS

FIG. 6 is a cross sectional partial view of an imaging device in a stage of manufacture in accordance with an embodiment described herein.

FIG. 8A is a cross sectional partial view of an imaging device in a stage of manufacture in accordance with an embodiment described herein.

DETAILED DESCRIPTION OF PREFERRED EMBODIMENTS

In the following detailed description, reference is made to various specific embodiments which may be practiced. These embodiments are described with sufficient detail to enable those skilled in the art to make and use them, and it is to be understood that other embodiments may be employed, and that structural and electrical changes may be made without departing from the scope or spirit of the invention.

The variation in color filter array thickness over the settling distance s is at least partially caused by the surface tension of the filter material when the filter material is flowed into the recess during formation of the color filter array. Embodiments described herein provide tension breaking features arranged at the edge of the color filter array recess to break the surface tension of the filter material during flow and reduce the settling distances of the color filter array.

Figure 1:
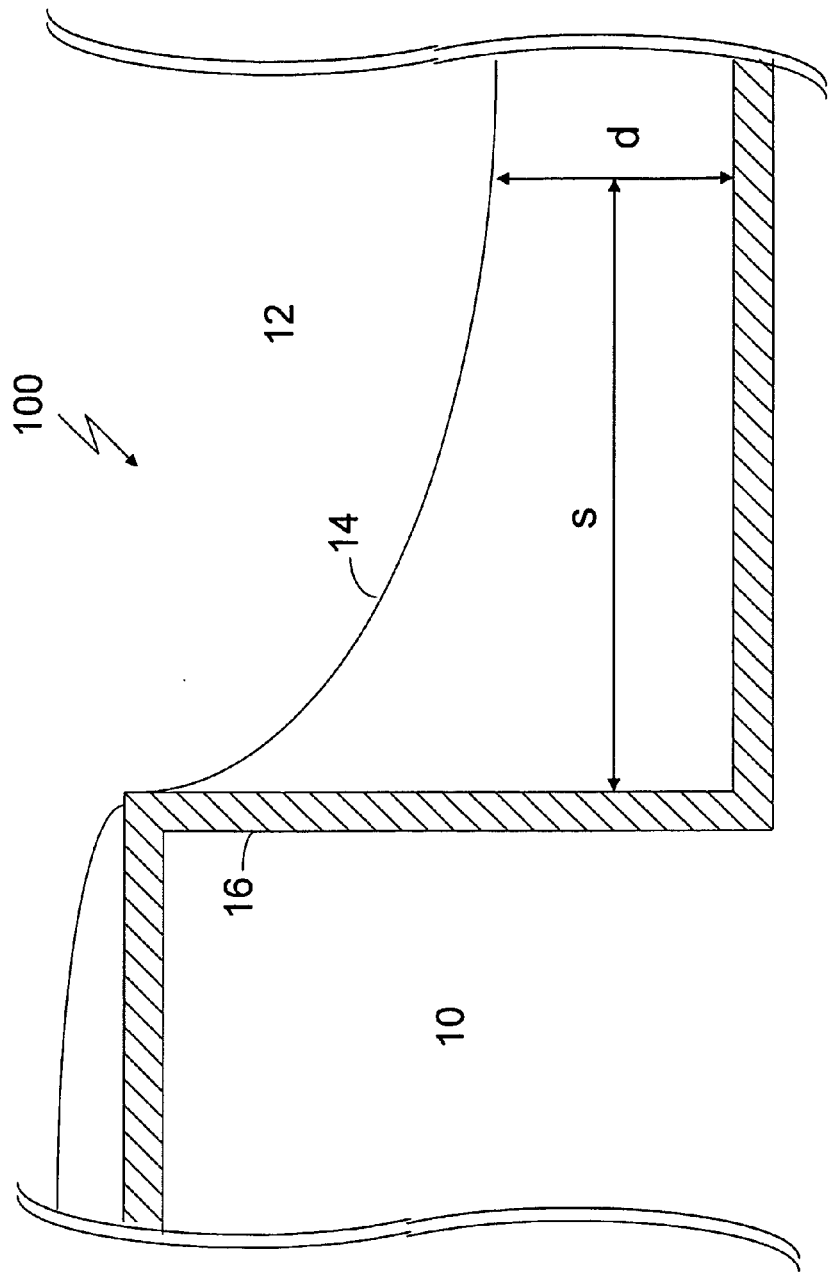
FIG. 1 is a cross sectional partial view of a conventional imaging device.
Figure 2A:
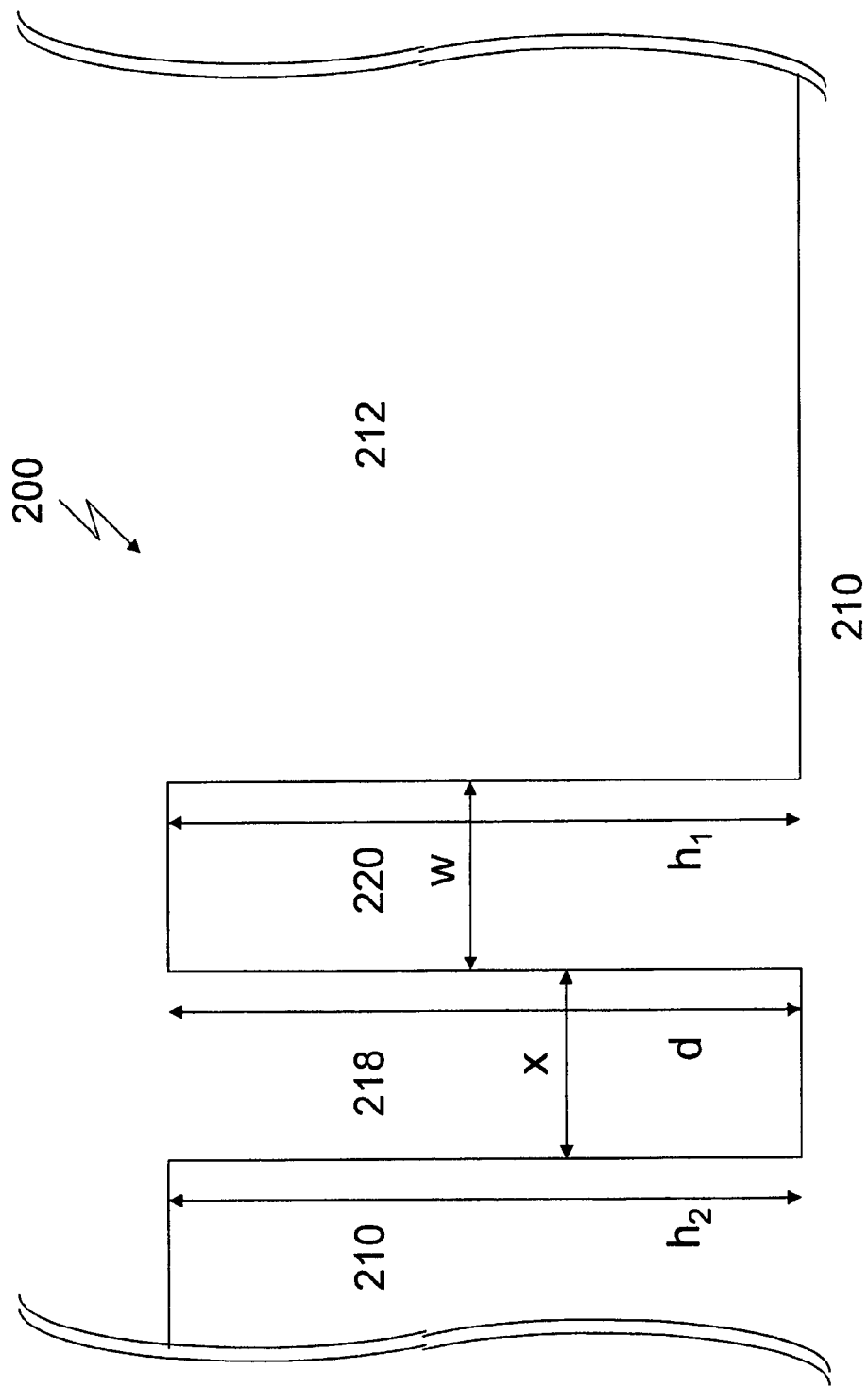
FIG. 2A is a cross sectional partial view of an imaging device in a stage of manufacture in accordance with an embodiment described herein.
Figure 2B:
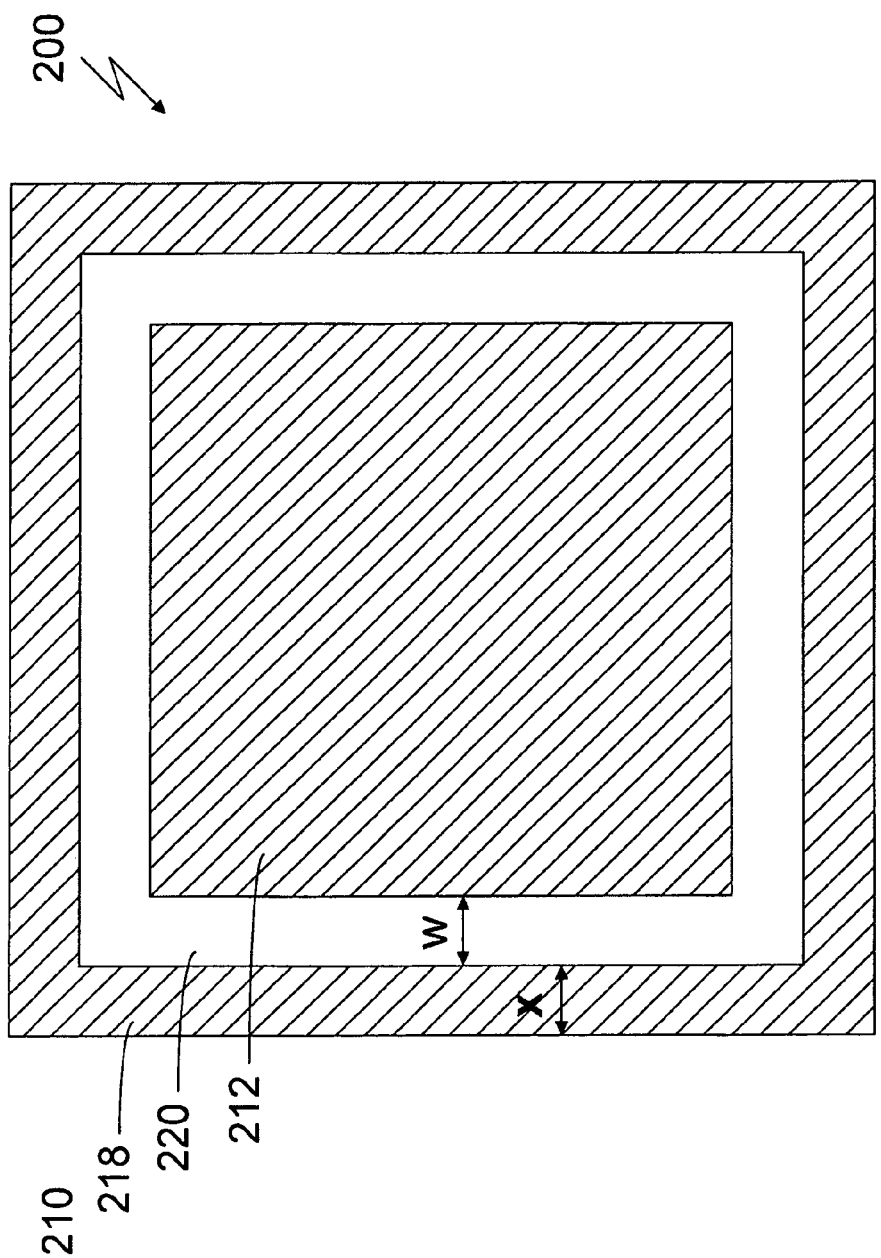
FIG. 2B is a top down view of the imaging device of FIG. 2A.

Referring now to the drawings, where like elements are designated by like reference numerals, FIGS. 2A-2D illustrate a method of forming a recessed color filter array having a tension breaking feature according to an embodiment. FIG. 2A is a cross sectional view of an imaging device 200 at a beginning stage of fabricating the color filters. FIG. 2B is a top down view of the imaging device 200 of FIG. 2A. The imaging device 200 includes a substrate layer 210, which is etched using a mask and etching process to form a main recess 212 and a tension breaking trench 218 having a width x, which extends all around the main recess 212 as shown in the top down view FIG. 2B. The substrate layer 210 may be formed of any one of many materials, for example, silicon dioxide, BPSG, tetraethoxysilane (TEOS), or other materials. The substrate may include one or more layers of the same or different material. The area between trench 218 and the main recess 212 defines a pillar forming a wall 220 extending around and defining the edge of the main recess 212. The wall 220 has a width w. The width x of the trench 218 and the width w of the wall 220 have dimensions which are sufficient to break the surface tension of the filter material and reducing the settling distance s (FIG. 1). The values of x and w will vary depending on the size of the recess 212, but in one embodiment x may be in the range of about 2 microns to about 100 microns and w may be in a range of about 2 microns to about 100 microns. The depth d of the trench 218 may be between about 0.5 microns to about 3 microns deep.

While the wall 220 actually resembles a pillar when seen in profile in the embodiment depicted in FIG. 2A, as noted, the wall 220 actually extends around the entirety of the main recess 212 as shown in FIG. 2B. In other embodiments, the trench 218 may surround only a portion of the main recess 212 or may be broken up to surround multiple portions of the main recess 212 so that the wall 220 may not extend all around the main recess 212 periphery.

The trench 218 and the main recess 212 are preferably formed at the same time so that the trench 218 does not require a forming step separate from that of the main recess 212. In the illustrated embodiment, the trench 218 and main recess 212 are formed to have the same depth. In another embodiment, the trench 218 and the main recess 212 may be formed using separate etching steps and may be formed to different depths. In yet another embodiment, the trench 218 may be formed at the same time as the main recess 212 and may have a different depth due to the presence of an etch stop material provided within substrate layer 210 at the location of trench 218. The etch stop material may be a metal layer or other material that resists etching, such as silicon nitride. In yet another embodiment, the wall 220 may be etched or otherwise modified so that the height $h_1$ of the upper level of the wall 220 is lower than the height $h_2$ of the surrounding substrate layer 210.

Figure 2C:
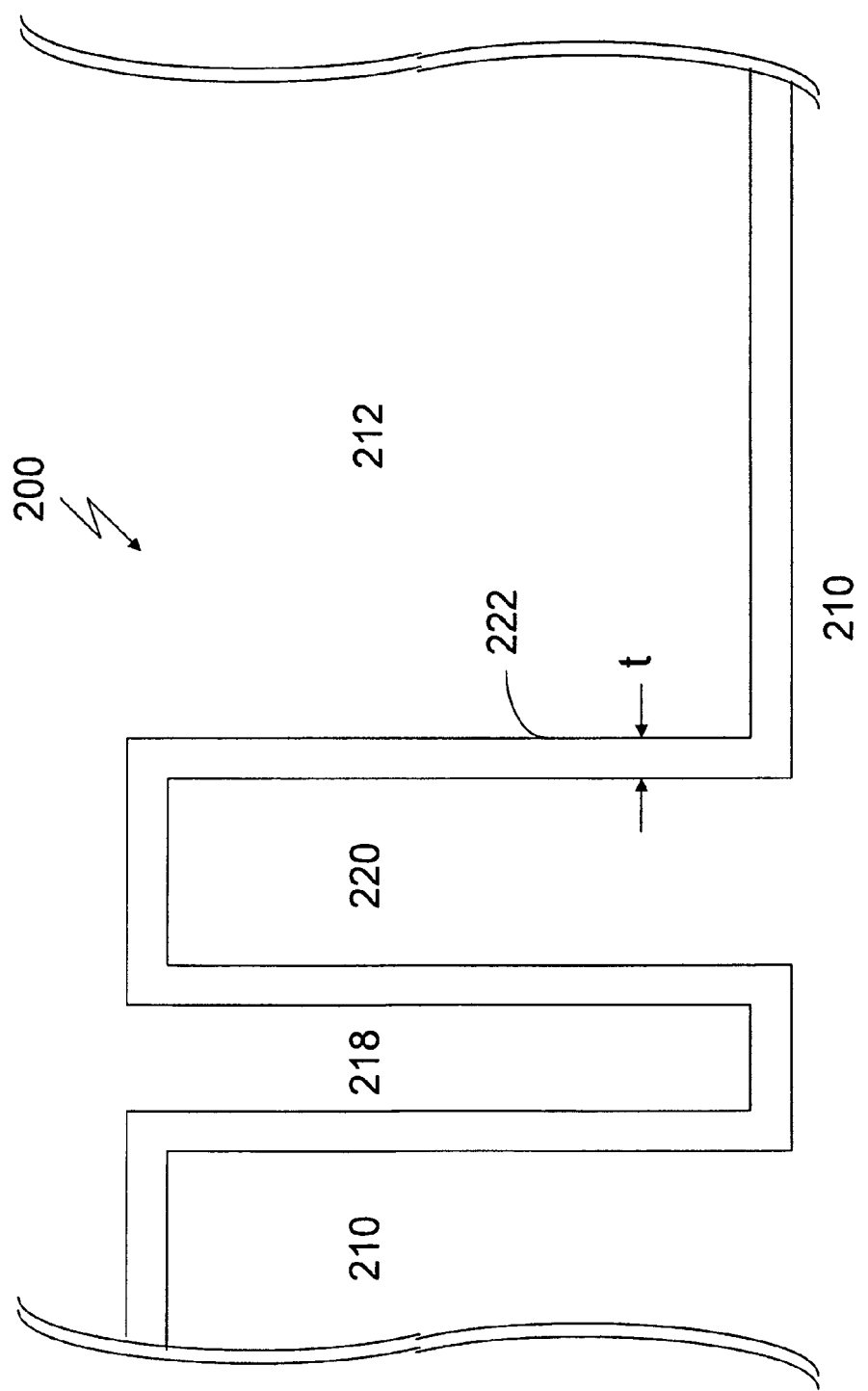
FIG. 2C is a cross sectional partial view of an imaging device in a stage of manufacture in accordance with an embodiment described herein.

As shown in FIG. 2C, a nitride passivation layer 222 of thickness t is optionally formed on the surface of the substrate layer 210, main recess 212, wall 220, and the trench 218. It should be apparent that the width x of the tension breaking trench 218 must be wide enough to accommodate two times the thickness t of the nitride layer 222 and still have room to allow a filter material to flow therein and coat to below the top of the wall 220. In another embodiment, the nitride passivation layer 222 may be omitted.

Figure 2D:
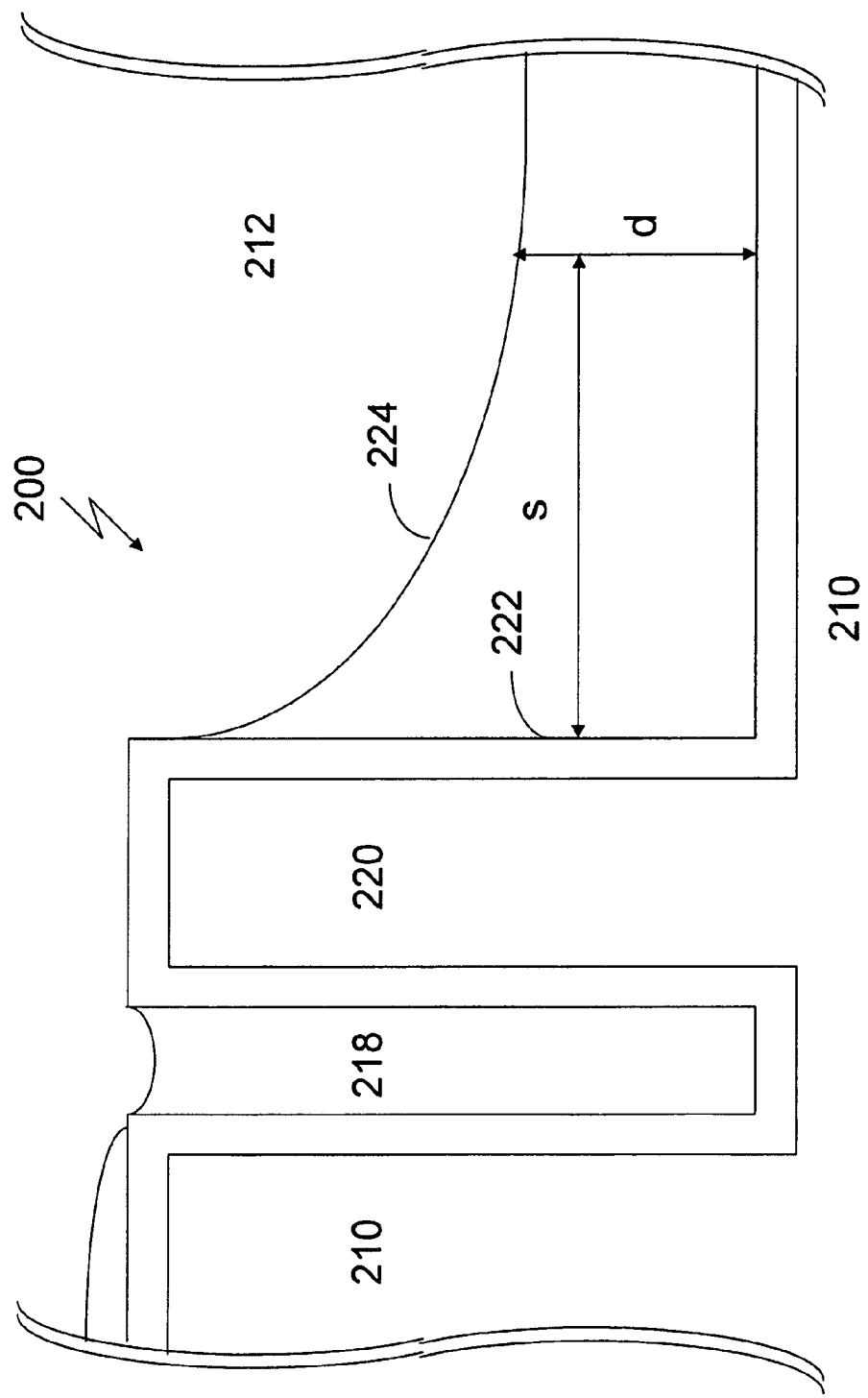
FIG. 2D is a cross sectional partial view of an imaging device in accordance with an embodiment described herein.

As shown in FIG. 2D, a first filter material in liquid form, such as a green filter material, is flowed across the substrate layer 210, including the trench 218, the wall 220, and the main recess 212 by a method such as spin coating. The trench 218 and the wall 220 serve to break the surface tension of the filter material and reduce the settling distance s by as much as about 20 μm. The first filter material is exposed, for example, to ultraviolet light through a mask and developed into a pattern of color filters and then cured. The first filter material is developed into a pattern of color filters, for example, by using a solvent to remove portions of the filter material that are not developed from the substrate layer 210, including the main recess 218 and the trench 218. The first filter material is then cured again. The coating, exposing, developing, and curing steps are repeated to form filters of other colors in the color filter array 214, and may include, for example, repeating the steps using blue filter material to form blue filters and then again using red filter material to form red filters. The trench 218 and the wall 220 serve to break the surface tension of each of the applied color filter materials.

Figure 3A:
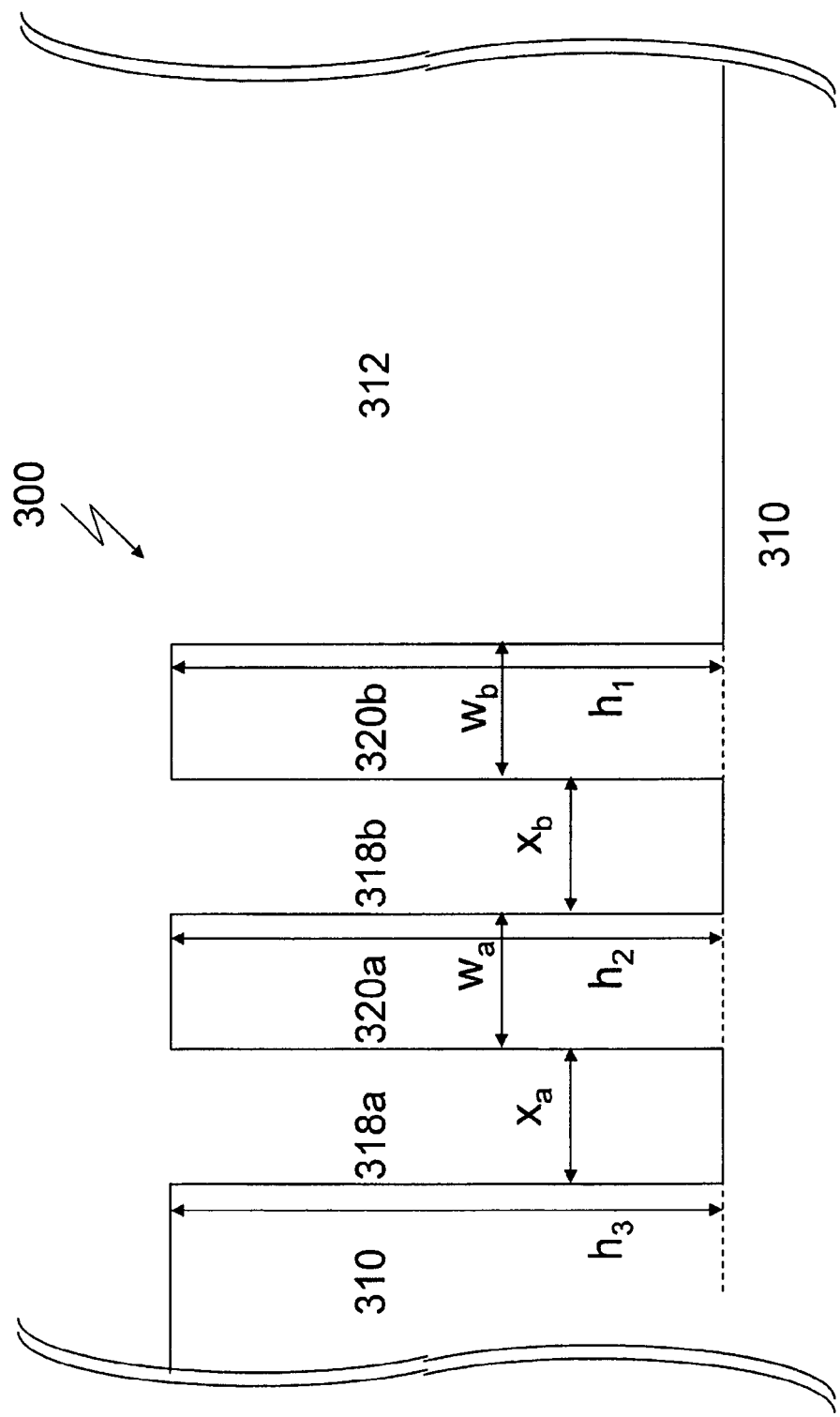
FIG. 3A is a cross sectional partial view of an imaging device in a stage of manufacture in accordance with an embodiment described herein.
Figure 3B:
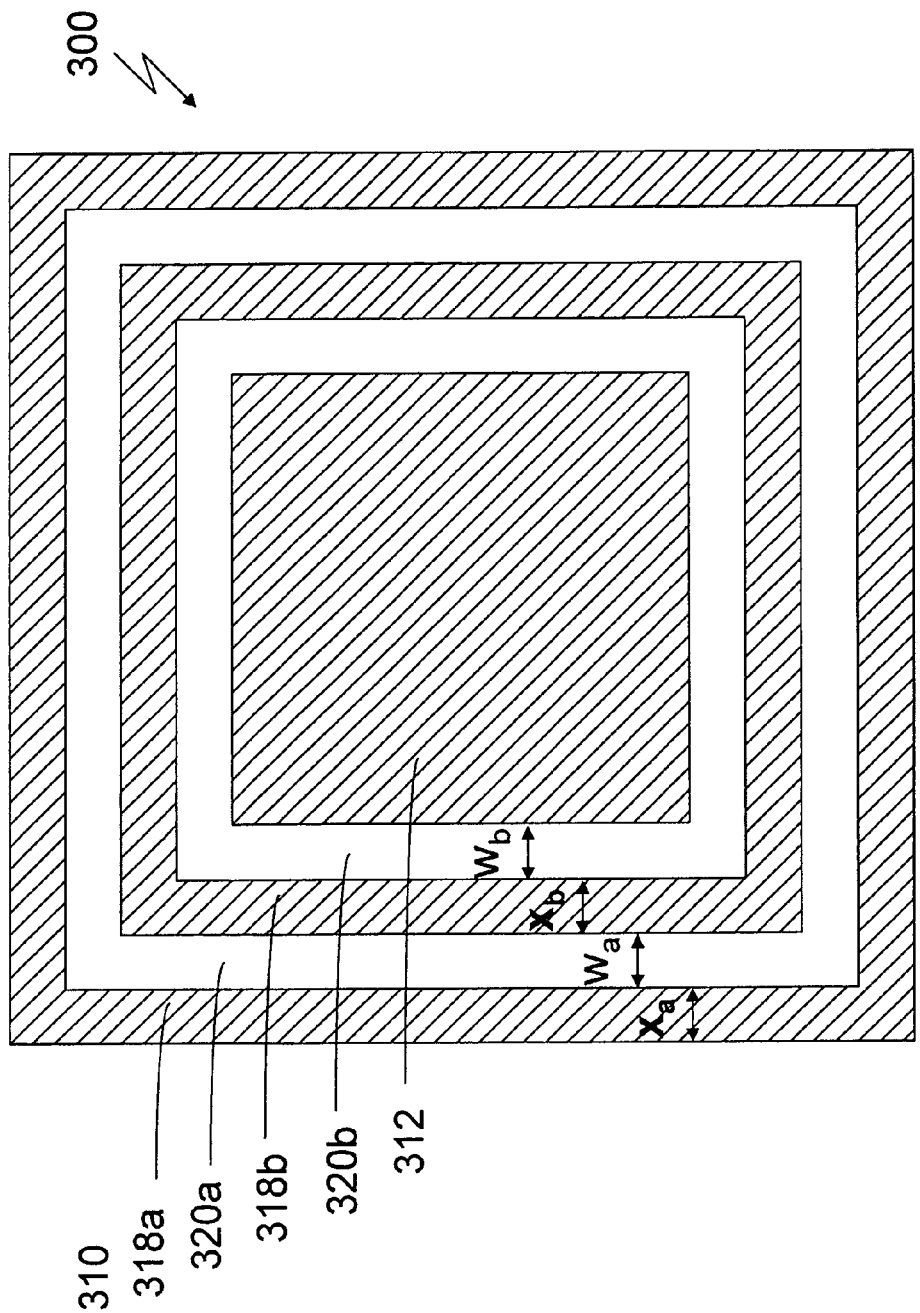
FIG. 3B is a top down view of the imaging device of FIG. 3A.
Figure 3C:
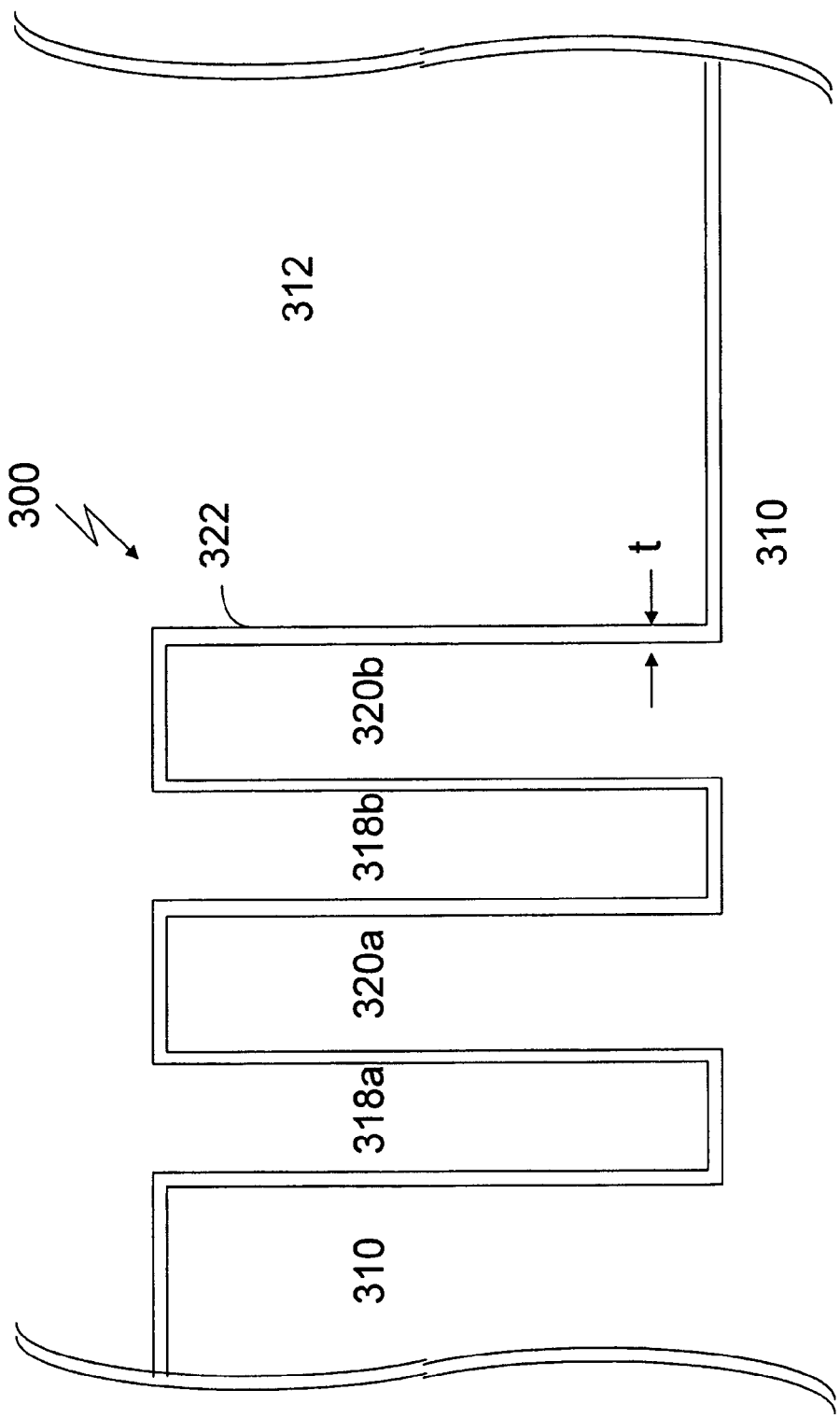
FIG. 3C is a cross sectional partial view of an imaging device in a stage of manufacture in accordance with an embodiment described herein.

FIGS. 3A-3D illustrate the formation of a recessed color filter array according to another embodiment. FIG. 3A is a cross sectional view of an imaging device 300 at a beginning stage of the fabrication of the color filters. FIG. 3B is a top down view of the imaging device 300 of FIG. 3A. The imaging device 300 includes a substrate layer 310, made of, for example, silicon dioxide, BPSG, or other materials, which is etched using a mask and etching process to form a main recess 312 for the color filter array and two tension breaking trenches 318a and 318b having widths of $x_a$ and $x_b$, respectively. The area between trenches 318a, 318b and the main recess 312 define two walls 320a, 320b having widths of $w_a$ and $w_b$, respectively. In other embodiments, it is possible to form additional trenches and walls, such as three trenches and three walls, four trenches and four walls, or more.

In the embodiment shown in FIGS. 3A and 3B, the widths $x_a$, $x_b$ of the tension breaking trenches 318a, 318b and the widths $w_a$, $w_b$ of the walls 320a, 320b are all equal. In other embodiments, the widths $x_a$, $x_b$ of the tension breaking trenches 318a, 318b may be different from the widths $w_a$, $w_b$ of the walls 320a, 320b. In yet another embodiment, each trench and each wall may have a different width.

In FIG. 3B, the trenches 318a, 318b are shown as completely surrounding the main recess 312 facing the walls 320a, 320b. In other embodiments, the trenches 318a, 318b may surround the same or different portions of the main recess 312 or may be broken up to surround the same or different multiple portions of the main recess 312.

In one embodiment, the trenches 318a, 318b and the main recess 312 may be formed at the same time and to the same depth so that the trenches 318a, 318b do not require separate steps from that of the main recess 312 for formation. In another embodiment, the trenches 318a, 318b, and the main recess 312 may be formed using separate steps and may have different depths. In yet another embodiment, the walls 320a, 320b may be etched or otherwise modified so that the height $h_2$, $h_1$ of the walls 320a, 320b is lower than the distance $h_3$ from the top of the substrate 310 to the surface of the main recess 312. The height $h_2$, $h_1$ of the walls 320a, 320b may be equal or different.

In another embodiment, as shown in FIG. 6, trenches 618a, 618b may be formed at the same time as the main recess 612 and one trench 618b may have a different depth by using an etch stop layer 622 to control the depth $h_1$ of the trench 618b. In another embodiment, both trenches 618a, 618b may be formed to the same depth using one etch stop layer 622 or to different depths by using different multiple etch stop layers 622. The etch stop layer 622 may be a metal layer or another commonly employed etch stop material.

Figure 5:
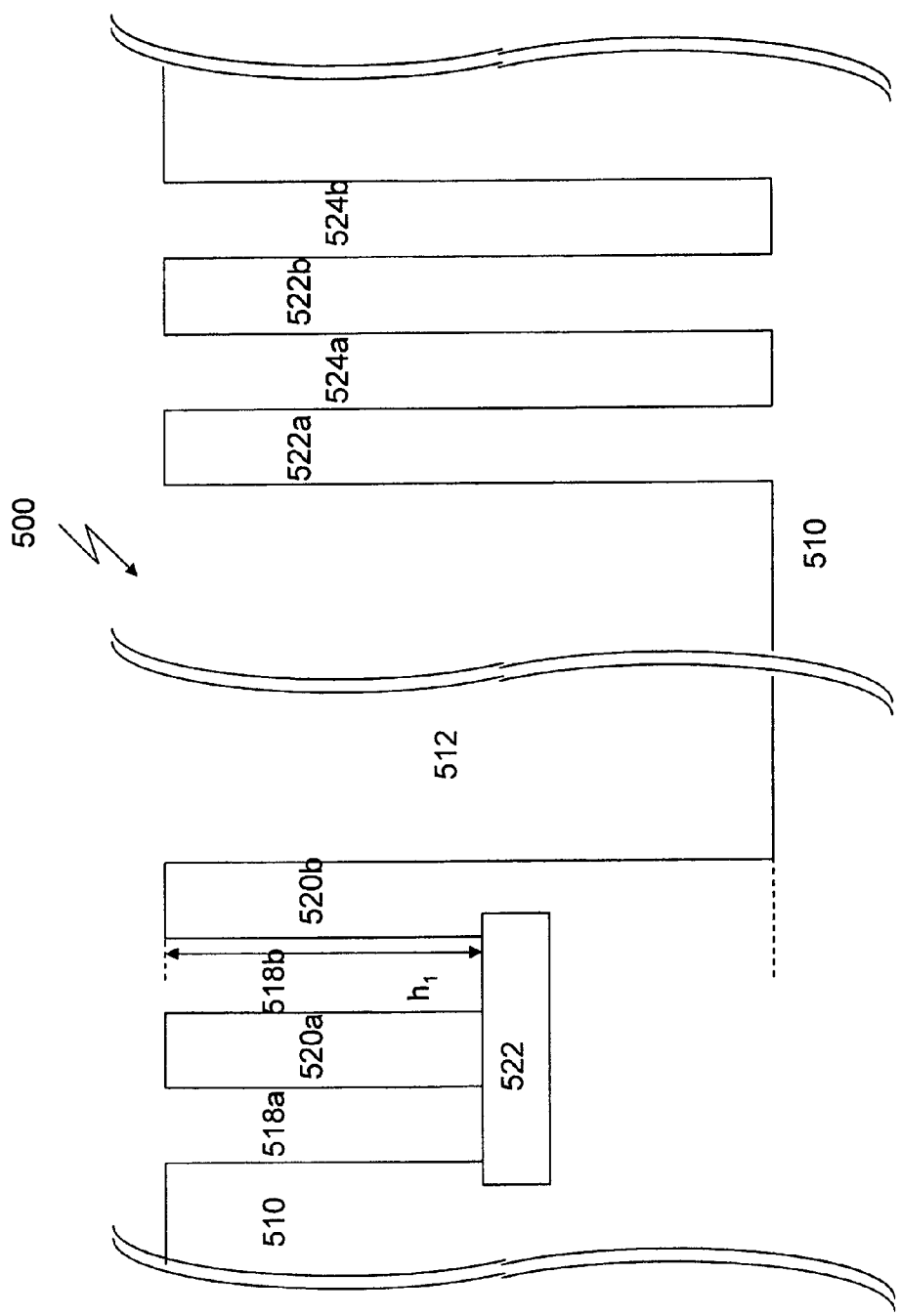
FIG. 5 is a cross sectional partial view of an imaging device in a stage of manufacture in accordance with an embodiment described herein.

In another embodiment, as shown in FIG. 5, the depth $h_1$ of one portion of the trenches 518a, 518b is controlled by an etch stop layer 522 while another portion of other trenches 524a, 524b is formed to the same depth as the main recess 512. In FIG. 5, the etch stop layer 522 is arranged at one side of the main recess 512, but in other embodiments, the etch stop layer 522 or multiple etch stop layers may be arranged at various locations around the main recess 512.

Figure 3D:
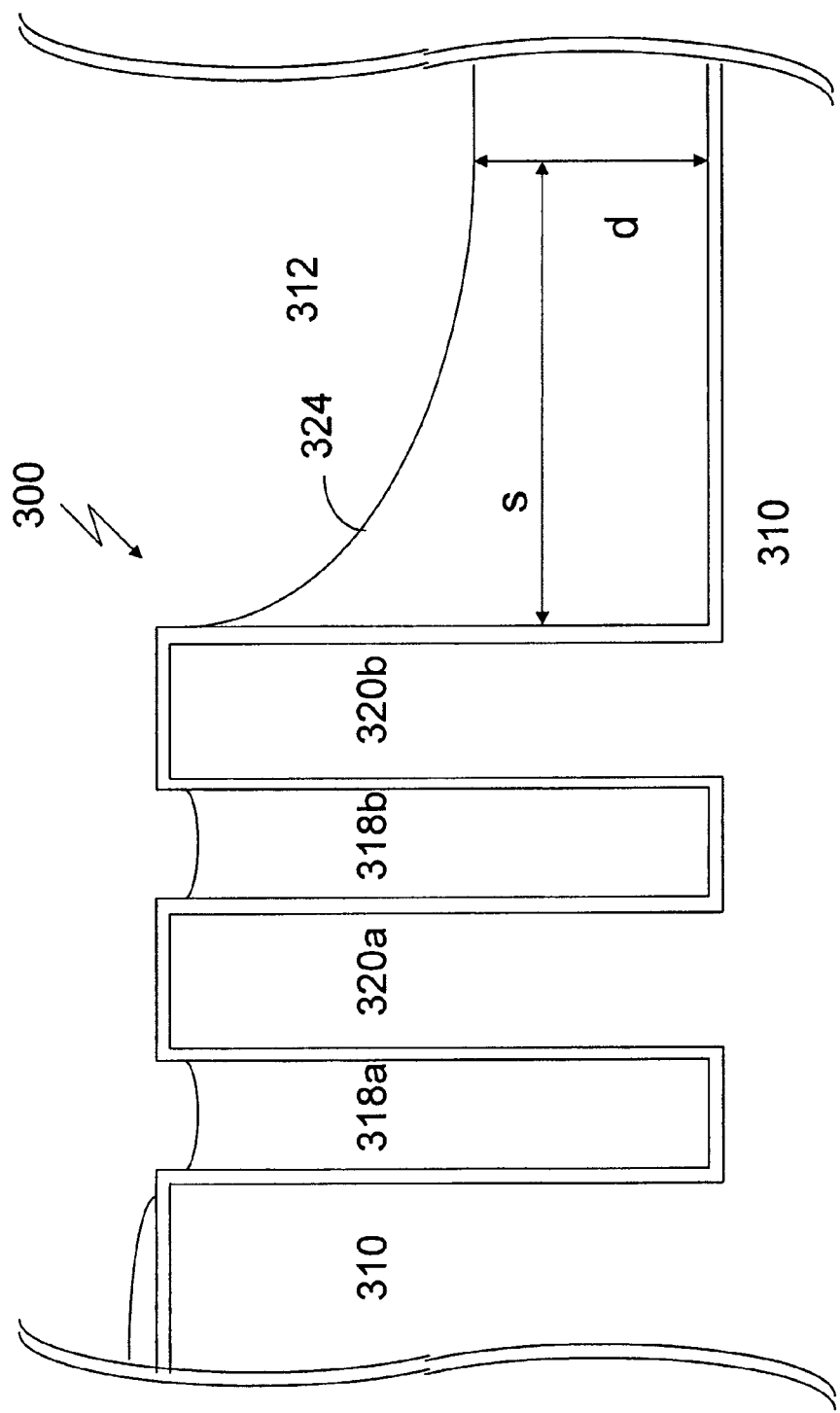
FIG. 3D is a cross sectional partial view of an imaging device in accordance with an embodiment described herein.

Referring back to FIGS. 3A-3C, as shown in FIG. 3C, a nitride passivation layer 322 of thickness t is optionally formed on the surface of the main recess 312, the walls 320a, 320b, and the trenches 318a, 318b as described above with respect to FIG. 2. As shown in FIG. 3D, different color filter materials used to form the filter array are sequentially deposited across substrate layer 310, including inside the trenches 318a, 318b and the main recess 312, and are exposed, developed, and cured to form the color filter array 324. For example, for a Bayer filter pattern, green, red, and blue color filter materials are deposited in the main recess 312 and patterned in sequence to form a color filter array.

Figure 4A:
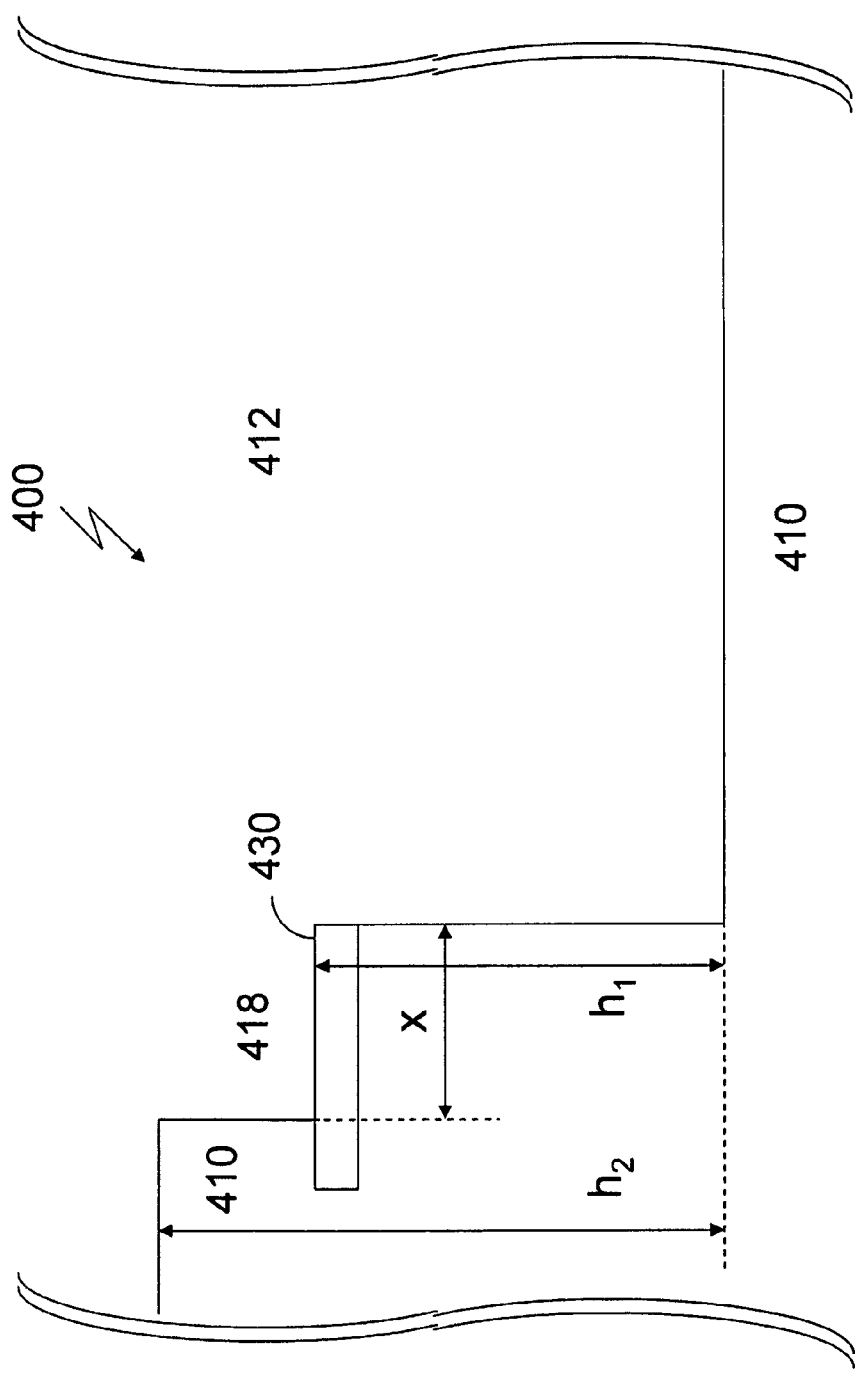
FIG. 4A is a cross sectional partial view of an imaging device in a stage of manufacture in accordance with an embodiment described herein.
Figure 4B:
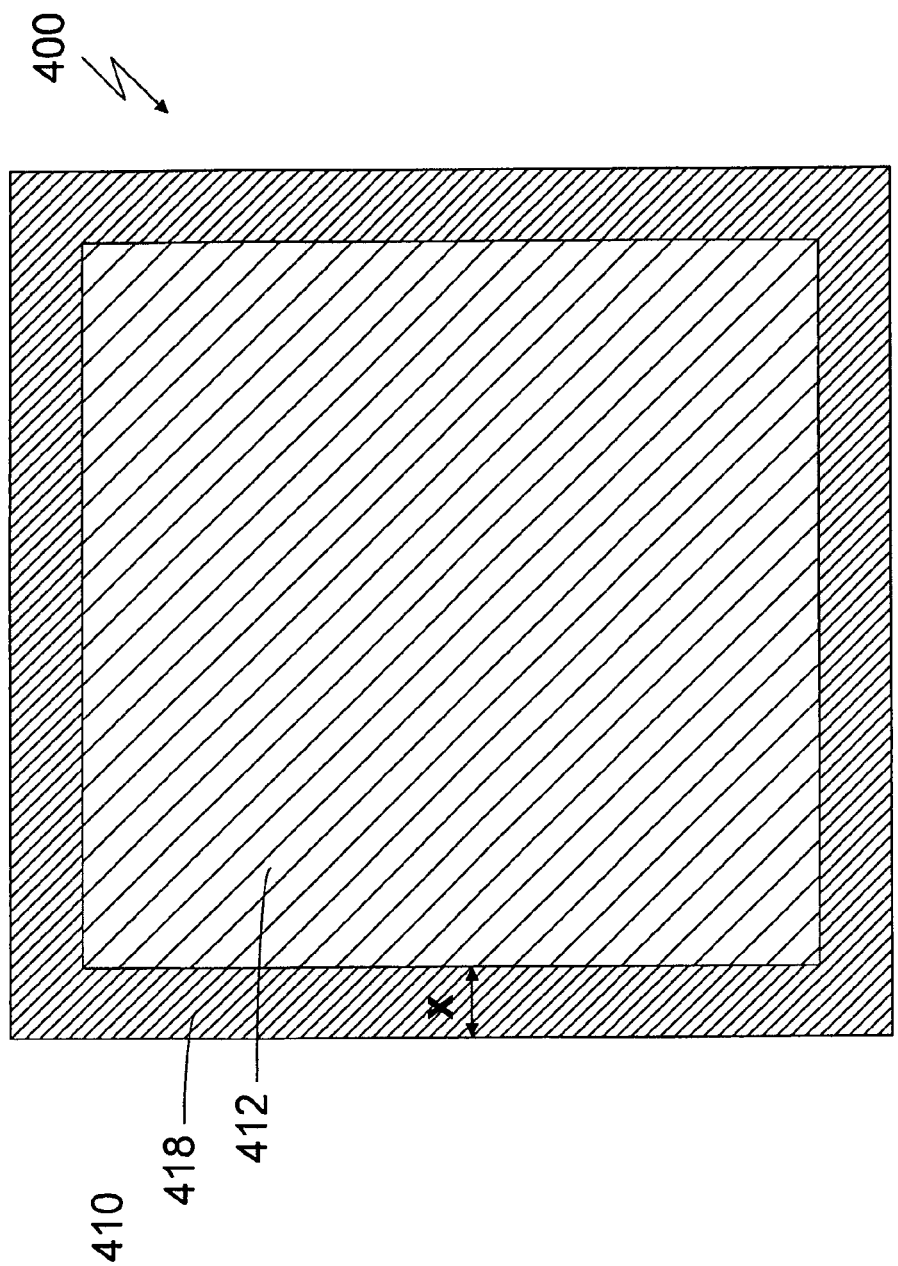
FIG. 4B is a top down view of the imaging device of FIG. 4A.

FIGS. 4A-4E illustrate the formation of a recessed color filter array according to another embodiment. FIG. 4A is a cross sectional view of an imaging device 400 at a beginning stage of fabrication of the color filters and FIG. 4B is a top down view of the imaging device 400 of FIG. 4A. The substrate layer 410 of the imaging device 400 is etched using a mask and etching process to form a main recess 412 for the color filter array and a tension breaking trench 418 having a width x. The width x of the tension breaking trench 418 is suited to break the surface tension of the color filter material, which is deposited within the main recess 412. Unlike the previously described embodiments, the tension breaking trench 418 is formed directly adjacent to the main recess 412, so that there is no intervening wall between the trench 418 and the main recess 412. It can be seen that the trench 418 forms a step or stair type configuration with the main recess 412.

In one embodiment, the trench 418 and the main recess 412 may be formed at different times using separate masking and etching steps to achieve different depths. In another embodiment, the trench 418 and the main recess 412 may be formed at the same time, such as by using an etch stop 430 to control the depth of the trench 418 so that the trench 418 does not require a forming step separate from that of the main recess 412. While only one trench 418 is shown in the embodiment depicted in FIG. 4A, in other embodiments multiple trenches 418a, 418b may be formed at various heights and widths $x_a$, $x_b$, such as in a staircase type configuration as shown in FIG. 4E. Multiple etch stop layers 430a, 430b may optionally be used.

Figure 4C:
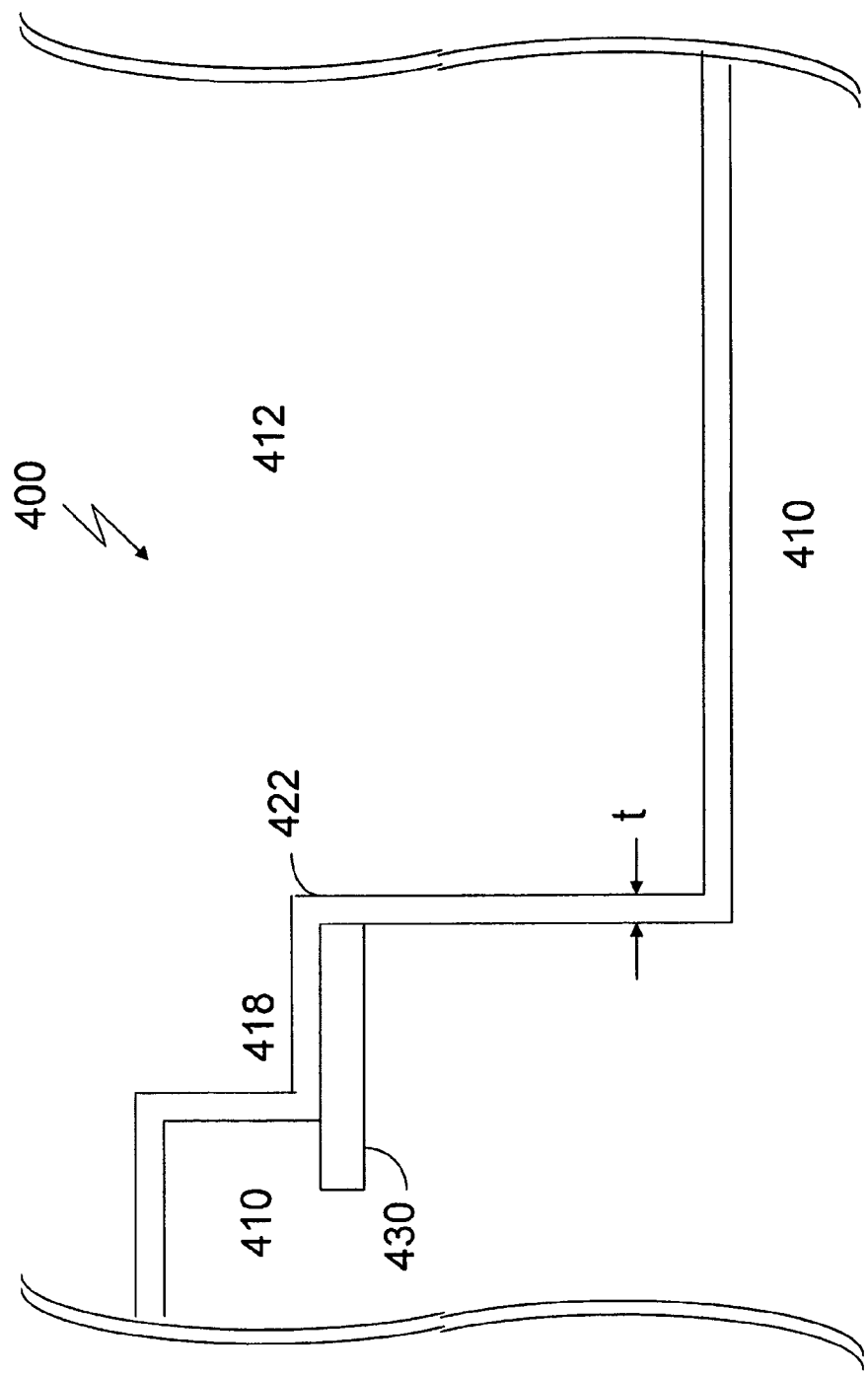
FIG. 4C is a cross sectional partial view of an imaging device in a stage of manufacture in accordance with an embodiment described herein.
Figure 4D:
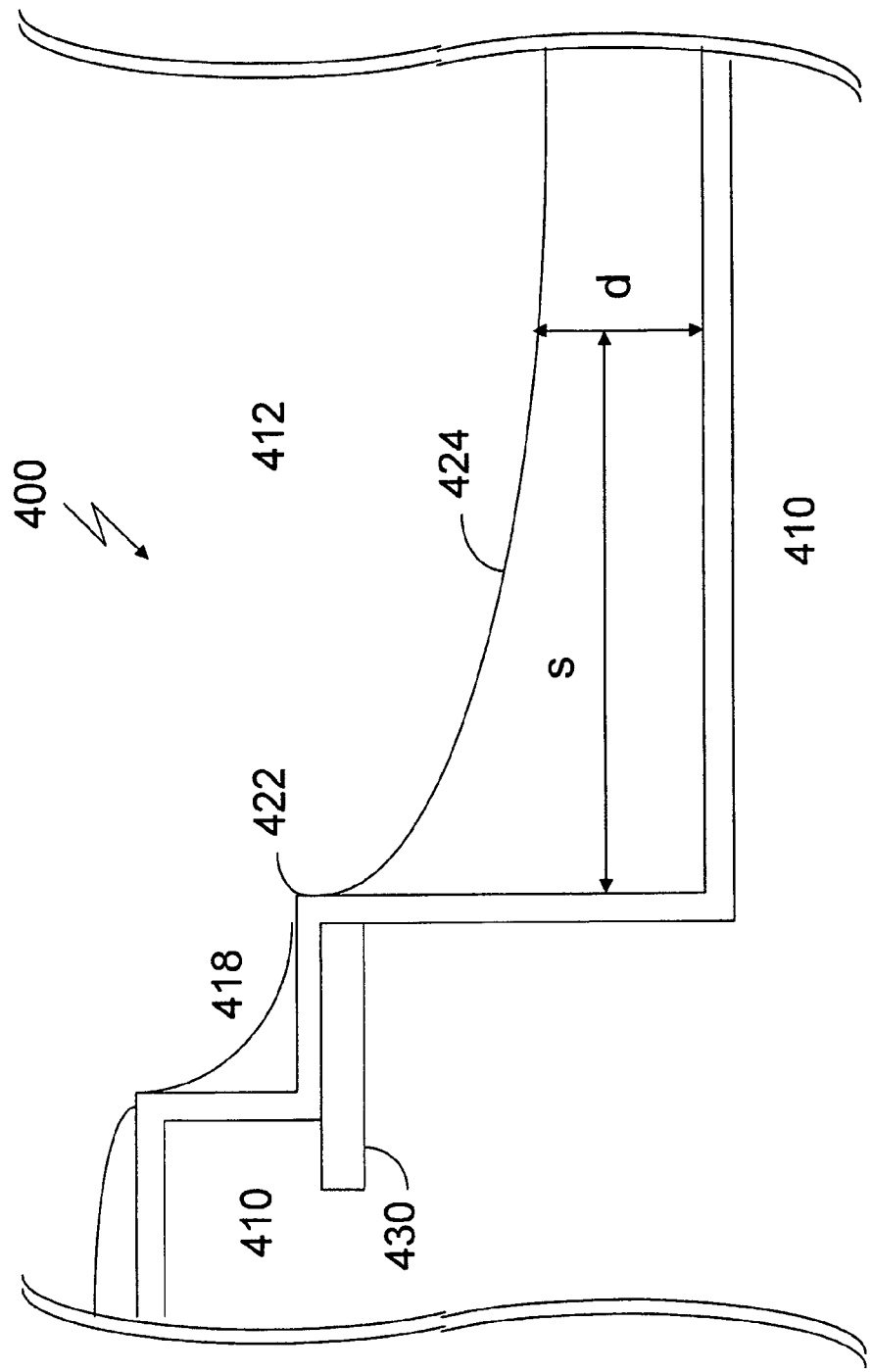
FIG. 4D is a cross sectional partial view of an imaging device in accordance with an embodiment described herein.
Figure 4E:
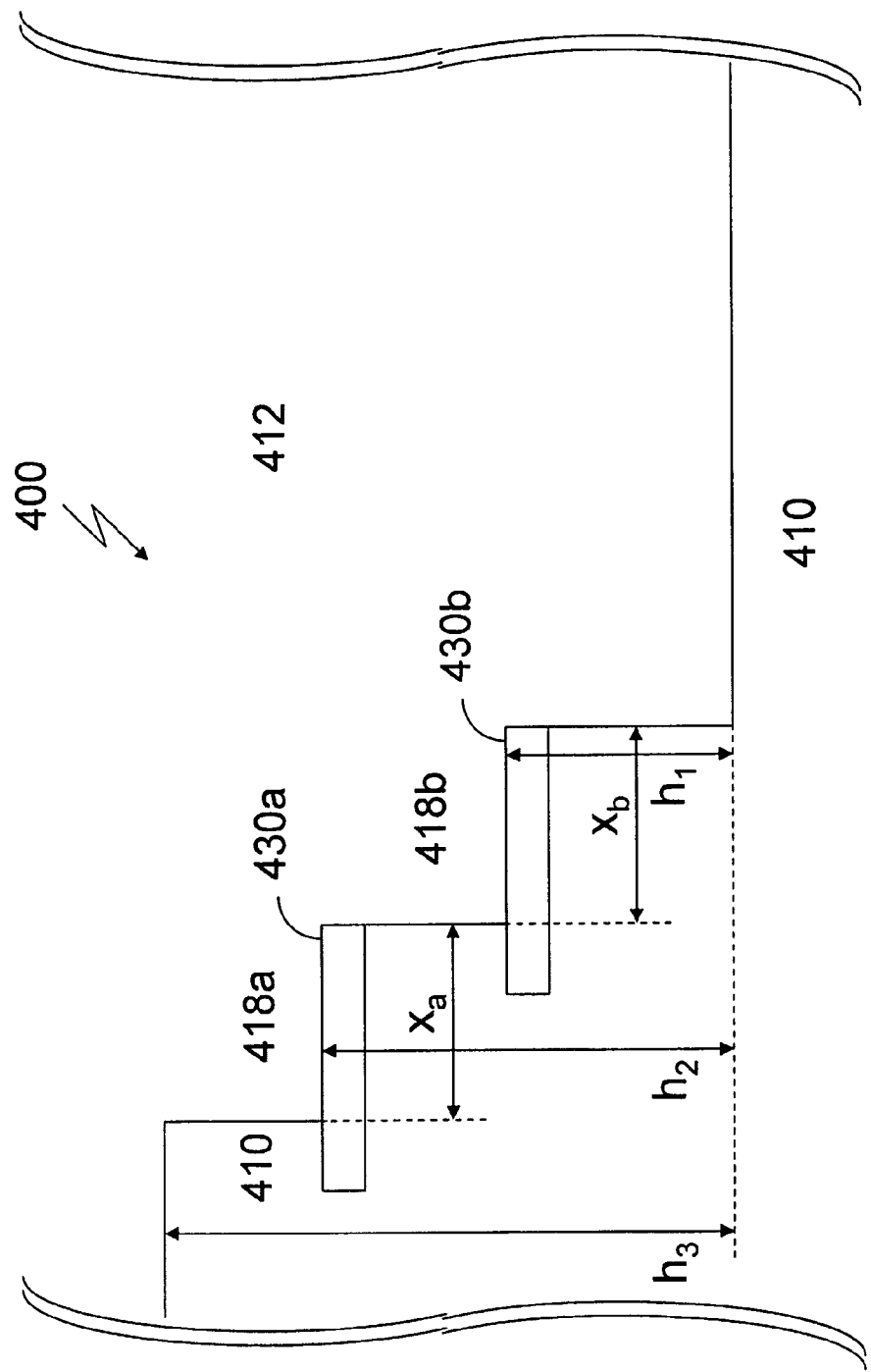
FIG. 4E is a cross sectional partial view of an imaging device in a stage of manufacture in accordance with an embodiment described herein.

As shown in FIG. 4C, a nitride passivation layer 422 of thickness t may optionally be formed on the surface of the main recess 412 and the trench 418. As shown in FIG. 4D, color filter materials are flowed across substrate layer 410, including the trench 418 and the main recess 412, exposed, and developed to form the color filter array 424, in sequence. The trench 418 serves to break the surface tension of the filter material and reduce the settling distance s thereof.

Figure 7A:
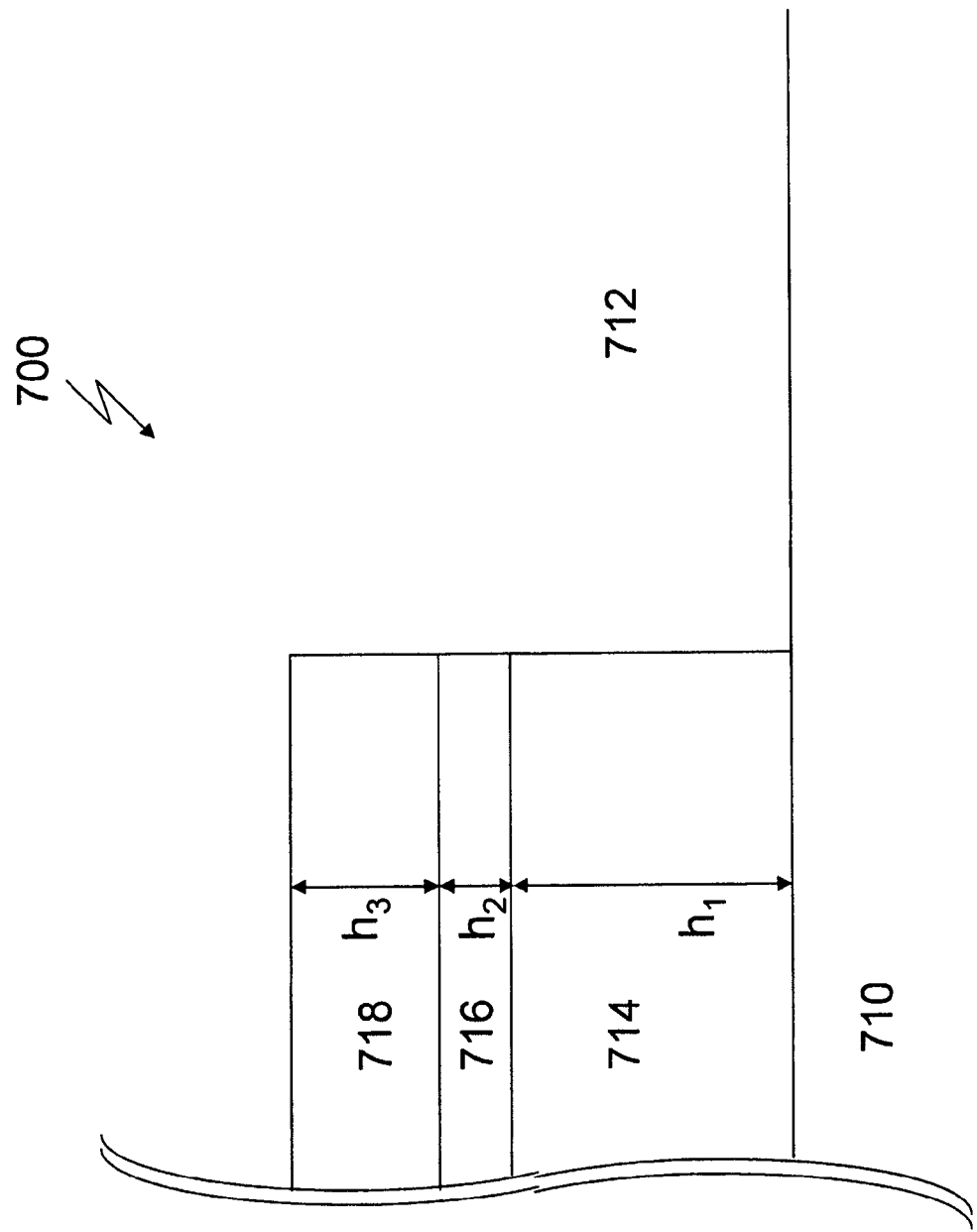
FIG. 7A is a cross sectional partial view of an imaging device in a stage of manufacture in accordance with an embodiment described herein.
Figure 7B:
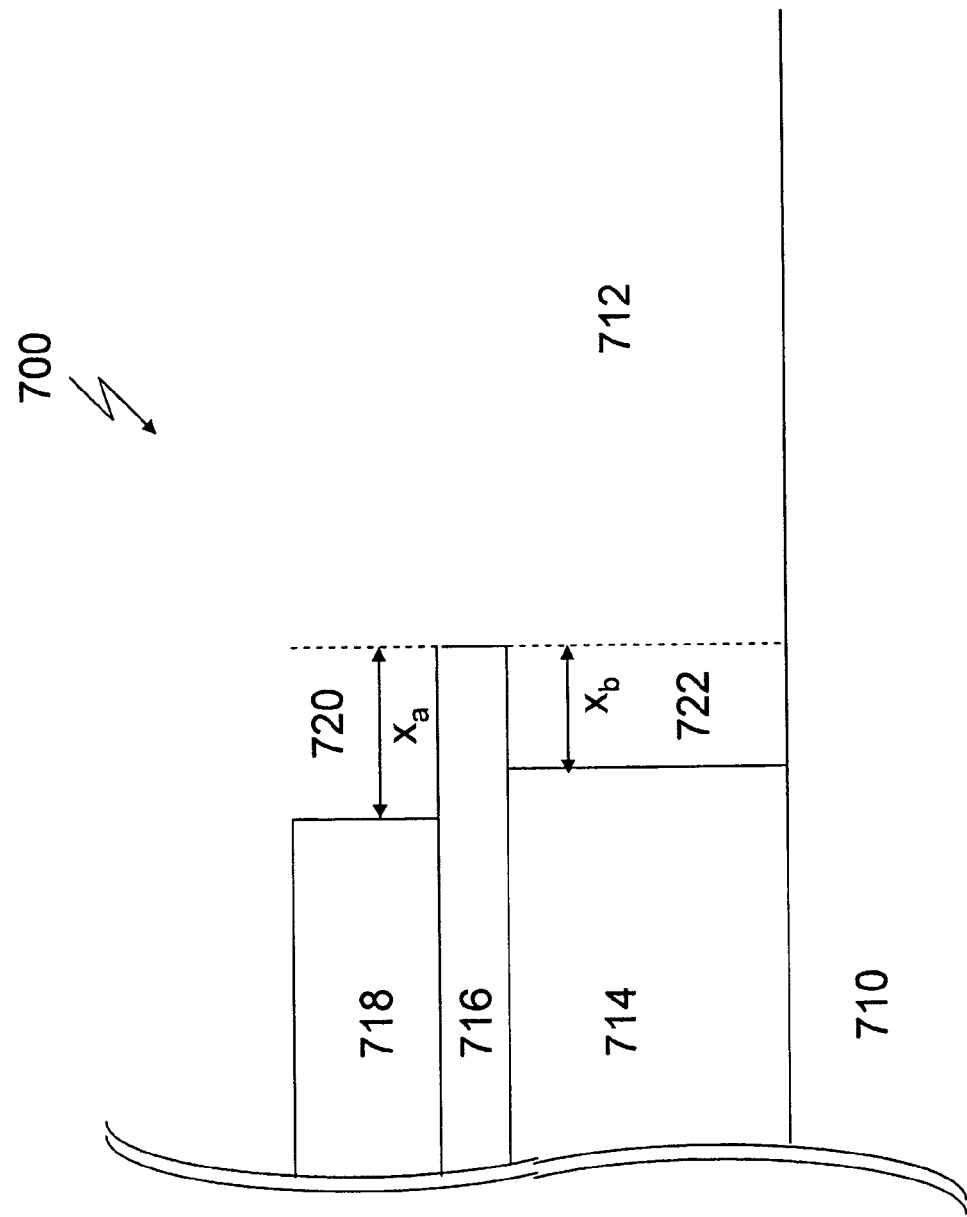
FIG. 7B is a cross sectional partial view of an imaging device in a stage of manufacture in accordance with an embodiment described herein.
Figure 7C:
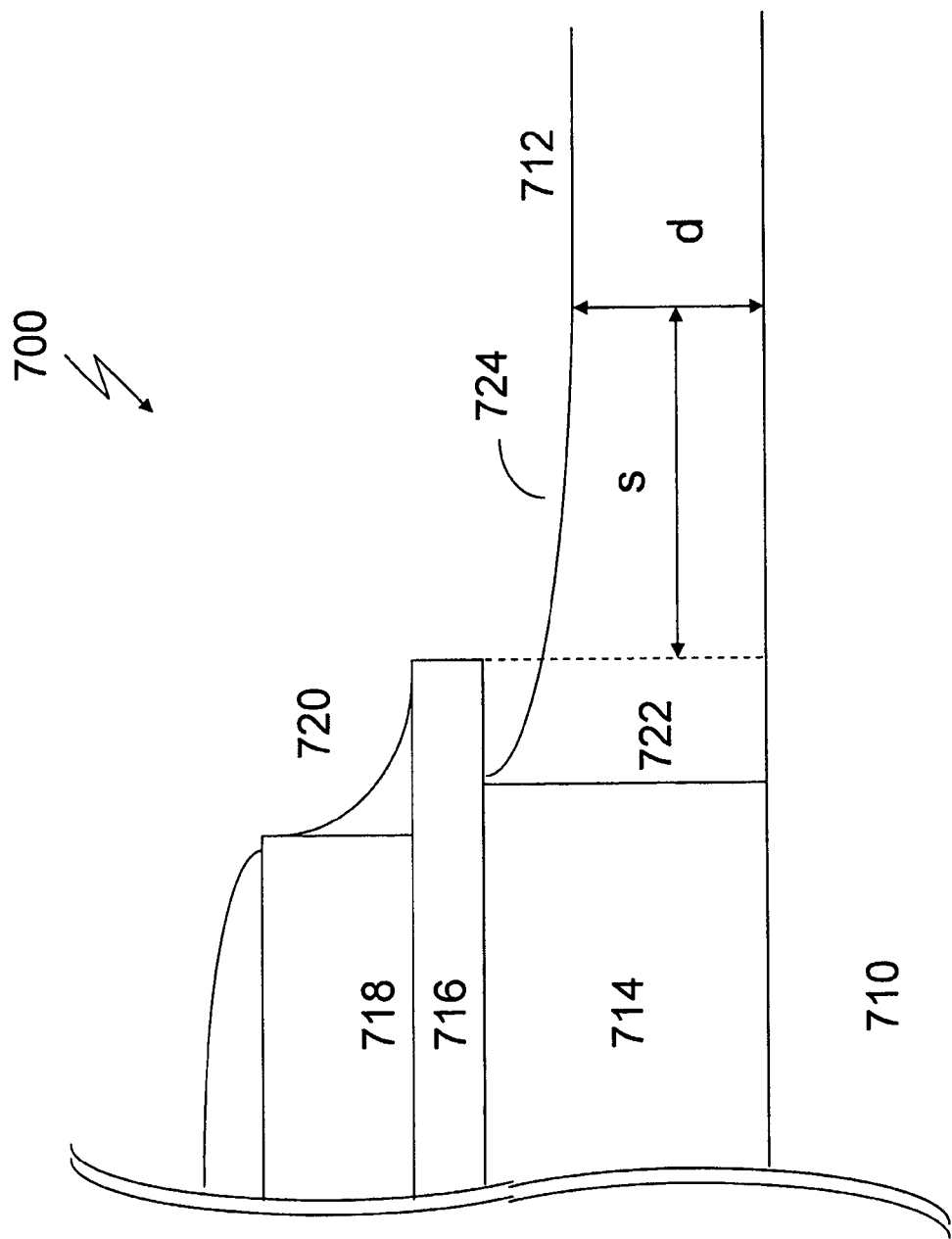
FIG. 7C is a cross sectional partial view of an imaging device in accordance with an embodiment described herein.

FIGS. 7A-7C illustrate the formation of a color filter array according to another embodiment. FIG. 7A is a cross sectional view of an imaging device 700 at a beginning stage of fabrication of the color filters. As shown in FIG. 7A, a first layer 714 of height $h_1$, second layer 716 of height $h_2$, and third layer 718 of height $h_3$ are arranged sequentially on a substrate layer 710 of the imaging device 700. The main recess 712 for the color filter array is formed using an anisotropic etch to etch the first layer 714, second layer 716, and third layer 718.

In one embodiment, the first layer 714 and the third layer 718 are made up of the same material, such as silicon oxide or a metal, such as aluminum, while the second layer 716 is made up of a different material, such as silicon nitride. As shown in FIG. 7B, when the first layer 714 and the third layer 718 are the same material, the first layer 714 and the third layer 718 may be etched at the same time using an isotropic etch to form a tension breaking trench 720 having a width $x_a$ in the third layer 718 and a tension breaking recess 722 having a width $x_b$ in the first layer 714, both shown in FIG. 7C. The tension breaking recess 722 is located beneath an overhanging ledge of the second layer 716 and the trench 720 is arranged directly adjacent to the main recess 712 so that there is no wall formed between the trench 720 and the main recess 712. In another embodiment, the first layer 714, the second layer 716, and the third layer 718 are all made up of different materials. In this embodiment, the third layer 718 may be etched using an anisotropic etch to form the trench 720 and the first layer 714 may be etched using an isotropic etch to form the recess 722. A nitride passivation layer may be optionally formed over the imaging device 700 before the color filter materials are deposited.

In the shown embodiment, the width $x_a$ of the trench 720 is shown to be greater than the width $x_b$ of the recess 722. In other embodiments, the trench 720 and the recess 722 may be the same width or the recess 722 may be wider than the trench 720. Additionally, the height $h_1$ of the first layer 714, the height $h_2$ of the second layer 716, and the height $h_3$ of the third layer 718 may be varied.

As shown in FIG. 7C, filter materials are flowed across the substrate layer 710, including the trench 720 and main recess 712, exposed, developed, and cured in a sequence of colors to form the color filter array 724. The trench 720 serves to break the surface tension of the filter material and reduce the settling distance s. Additionally, the recess 722 serves to move the portion of the color filter array 724 having the greatest variation in thickness away from being over the pixel array by a distance $x_b$ so that it is not used for color filters.

Figure 8B:
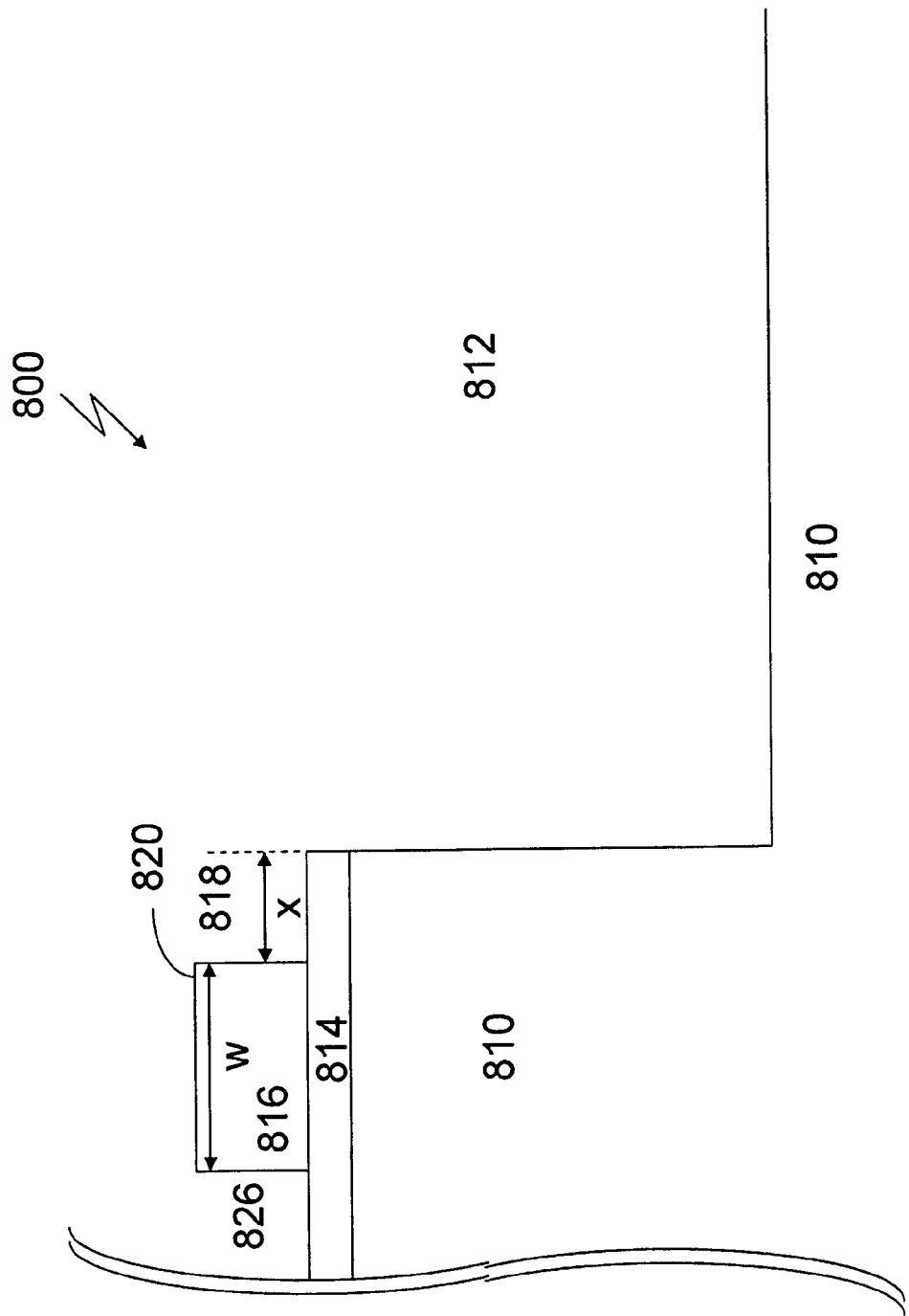
FIG. 8B is a cross sectional partial view of an imaging device in a stage of manufacture in accordance with an embodiment described herein.
Figure 8C:
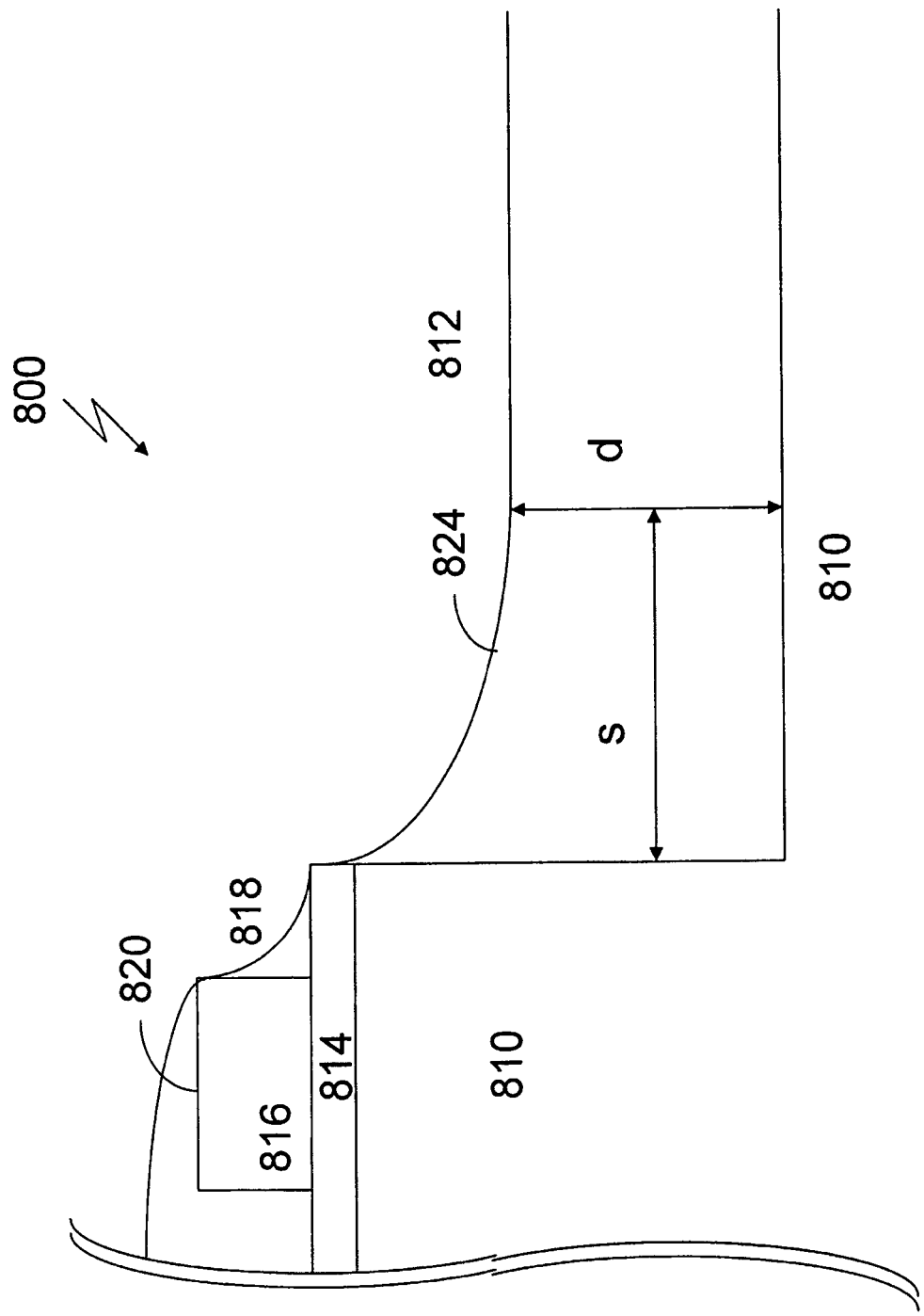
FIG. 8C is a cross sectional partial view of an imaging device in accordance with an embodiment described herein.

FIGS. 8A-8C illustrate the formation of a color filter array according to another embodiment. FIG. 8A is a cross sectional view of an imaging device 800 at a beginning stage of fabrication of the color filters. The imaging device 800 includes a substrate layer 810 having a height of $h_1$, a first layer 814 made up of a first material of height $h_2$, and a second layer 816 made up of a second material of height $h_3$. In one embodiment, the first layer 814 may be a metal layer and the second layer 816 may be a silicon nitride layer.

The substrate layer 810, the first layer 814, and the second layer 816 are etched using a mask and etching process to form a main recess 812. As shown in FIG. 8B, the second layer 816 is etched to form a tension breaking trench 818 having a width x, a wall 820 having a width w, and a second trench 826 on the opposite side of wall 820 from trench 818. The tension breaking trench 818 is formed directly adjacent to the main recess 812, so that the trench 818 is between the main recess 812 and the wall 820. The wall 820 and the trenches 818, 826 serve to break surface tension of a color filter material deposited in the main recess 812.

The width w of the wall 820 and the width x of the trench 818 may be varied and may be the same or different widths. Also, the height of the wall 820 may be varied by varying the thickness of the second layer 816. In another embodiment, multiple walls can be formed by etching the second layer 816.

A nitride passivation layer may optionally be formed on the imaging device 800 in the manner illustrated in FIG. 2; however, the optional nitride layer is omitted from FIGS. 8B and 8C. As shown in FIG. 8C, color filter materials are flowed across the substrate layer 810, including the wall 820, trench 818, and main recess 812, exposed, and developed in a sequence to form the color filter array 824. The trenches 818, 826 and the wall 820 serve to break the surface tension of the filter material and reduce the settling distance s.

Figure 9:
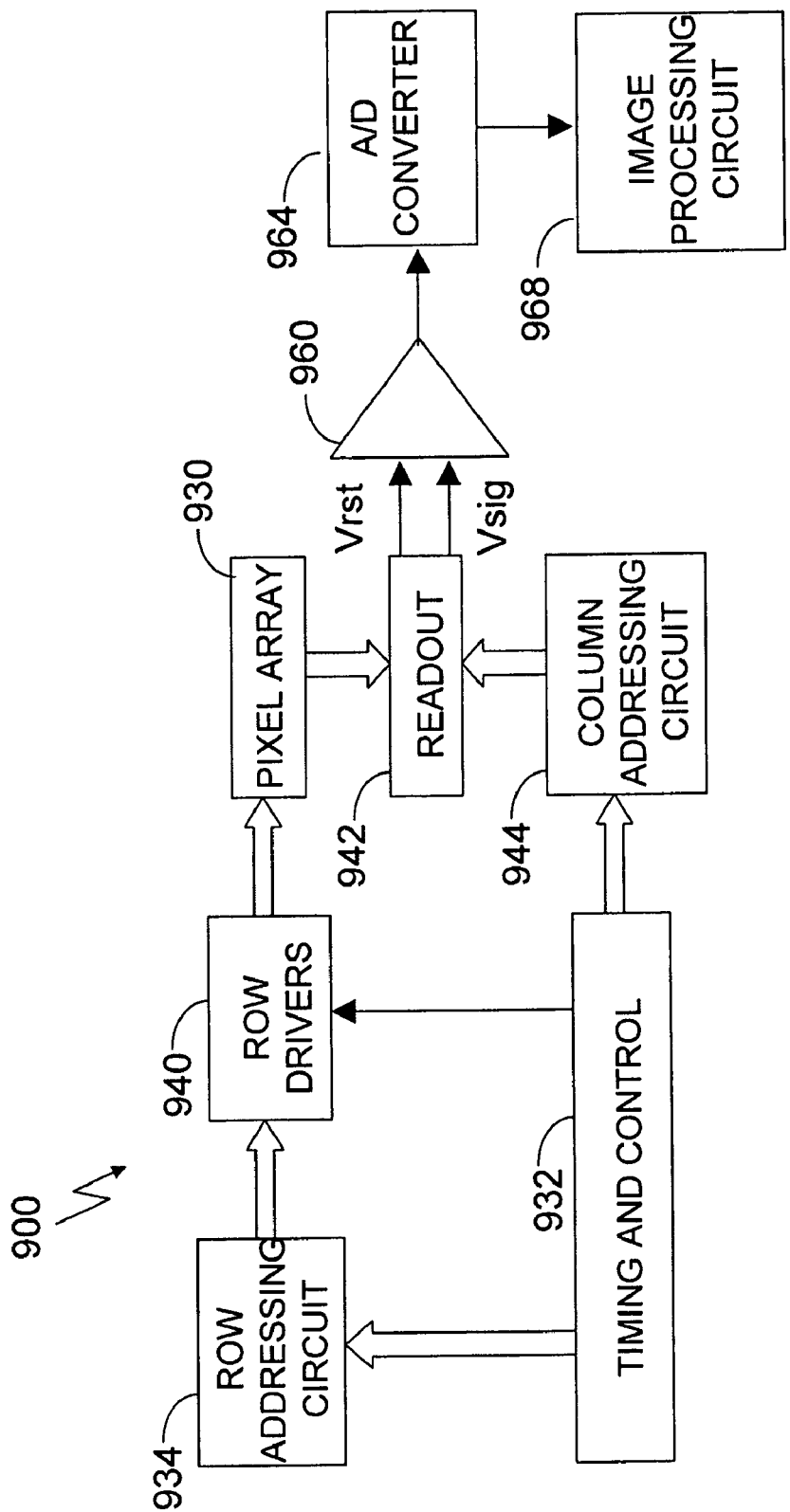
FIG. 9 is a block diagram of an imaging device manufactured in accordance with various embodiments described herein.

FIG. 9 shows a block diagram of an imaging device 900, e.g. a CMOS imaging device which includes a color filter array formed over the pixels of a pixel array 930. The color filter array is formed in accordance with embodiments described herein. A timing and control circuit 932 provides timing and control signals for enabling the reading out of signals from pixels of the pixel array 930 in a manner commonly known to those skilled in the art. The pixel array 930 has dimensions of M rows by N columns of pixels, with the size of the pixel array 930 depending on a particular application.

Signals from the imaging device 900 are typically read out a row at a time. The timing and control circuit 932 selects a particular row of pixels in the pixel array 930 by controlling the operation of a row addressing circuit 934 and row drivers 940. Signals stored in the selected row of pixels are provided to a readout circuit 942. The signals read from each of the columns of the array sequentially or in parallel using a column addressing circuit 944. The pixel signals corresponding to the pixel reset signal Vrst and image pixel signal Vsig are provided as outputs of the readout circuit 942, and are typically subtracted in a differential amplifier 960 and the result digitized by an analog to digital converter 964 to provide a digital pixel signal. The digital pixel signals represent an image captured by pixel array 930 and are processed in an image processing circuit 968 to provide an output image.

Figure 10:
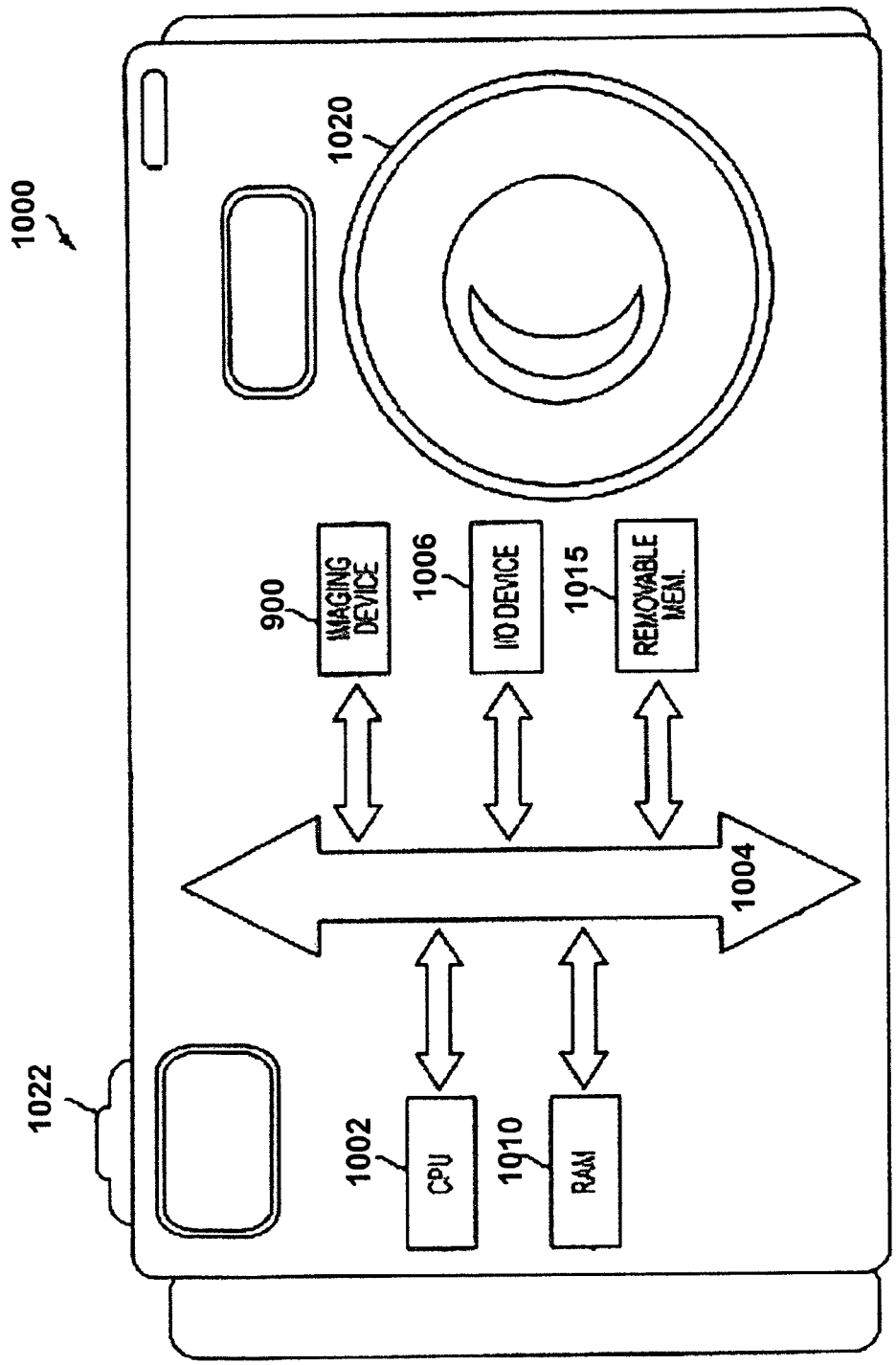
FIG. 10 shows a processor system that includes the imaging device of FIG. 9.

FIG. 10 shows a process system 1000 that includes an imaging device 900 constructed and operated in accordance the various embodiment described above. The processor system 1000 is a system having digital circuits that include imaging device 900. Without being limiting, such a system could include a computer system, camera system, scanner, machine vision, vehicle navigation, video phone, surveillance system, auto focus system, star tracker system, motion detection system, image stabilization system, or other image acquisition system.

System 1000, for example a digital still or video camera system, generally comprises a central processing unit (CPU) 1002, such as a control circuit or microprocessor for conducting camera functions, that communicates with one or more input/output (I/O) devices 1006 over a bus 1004. Imaging device 900 also communicates with the CPU 1002 over the bus 1004. The processor system 1000 also includes random access memory (RAM) 1010, and can include removable memory 1015, such as flash memory, which also communicates with the CPU 1002 over the bus 1004. The imaging device 900 may be combined with the CPU processor with or without memory storage on a single integrated circuit or on a different chip than the CPU processor. In a camera system, a lens 1020 is used to focus image light onto the pixel array 930 of the imaging device 900 and an image is captured when a shutter release button 1022 is pressed.

The above description and drawings are only to be considered illustrative of specific embodiments, which achieve the features and advantages described herein. Modification and substitutions to specific structures and methods can be made and features of the various disclosed embodiments may be combined. Accordingly, the invention is not to be considered as being limited by the foregoing description and drawings showing illustrative embodiments, but is only limited by the scope of the appended claims.

What is claimed as new and desired to be protected by Letters Patent of the United States is:

1. An imaging device, comprising:
    a main recess;
    a surface tension breaking feature arranged at an edge of the main recess, wherein the surface tension breaking feature comprises a trench, wherein the trench has a surface interposed between first and second edges, wherein the first edge is closer to the main recess than the second edge, and wherein the second edge is defined by a wall that extends above the surface; and
    a color filter array arranged in the main recess.

2. The imaging device of claim 1, wherein the trench is arranged adjacent to the main recess in a step configuration.

3. The imaging device of claim 2, wherein the trench is one of a plurality of trenches arranged adjacent to the main recess in a staircase configuration.

4. The imaging device of claim 1, wherein the tension breaking feature comprises an additional wall separating the trench from the main recess.

5. The imaging device of claim 4, wherein the depth of the trench is the same as the depth of the main recess.

6. The imaging device of claim 4, wherein the depth of the trench is less than the depth of the main recess.

7. The imaging device of claim 6, further comprising an etch stop, and wherein the depth of the trench is defined by the position of the etch stop.

8. An imaging device, comprising:
a main recess;
a surface tension breaking feature arranged at an edge of the main recess; and
a color filter array arranged in the main recess, wherein the tension breaking feature comprises a first trench separated from the main recess by a first wall and a second trench separated from the first trench by a second wall.

9. The imaging device of claim 8, wherein the first trench and the second trench have the same width.

10. The imaging device of claim 8, wherein the first trench and the second trench have different widths.

11. The imaging device of claim 1, wherein the surface tension breaking feature surrounds the main recess.

12. The imaging device of claim 8, wherein the depth of a first portion of the first trench and the depth of a first portion of the second trench are less than the main recess and the depth of a second portion of the first trench and the depth of a second portion of the second trench are the same as the depth of the main recess.

13. The imaging device of claim 12, further comprising at least one etch stop, and wherein the depth of the first portion of the first trench and the depth of the first portion of the second trench are defined by the position of the at least one etch stop.

14. The imaging device of claim 8, wherein the depth of the first trench is less than the depth of the second trench.

15. The imaging device of claim 14, further comprising an etch stop, and wherein the depth of the first trench is defined by the position of the etch stop.

16. The imaging device of claim 1, wherein the main recess is arranged in a stack comprising a first material, a second material arranged on the first material, and a third material arranged on the second material.

17. An imaging device, comprising:
a main recess;
a surface tension breaking feature arranged at an edge of the main recess; and
a color filter array arranged in the main recess, wherein the main recess is arranged in a stack comprising a first material, a second material arranged on the first material, and a third material arranged on the second material, and wherein the tension breaking feature comprises a trench arranged in the third material and a recess arranged in the first material.

18. The imaging device of claim 1, wherein the main recess is arranged in a stack comprising a substrate material, a first material arranged on the substrate material, and a second material arranged on the first material.

19. The imaging device of claim 18, wherein the wall and the trench are arranged in the second material.

20. The imaging device of claim 19, wherein the wall is separated from the main recess by the trench.

21. An imaging system comprising:
a processor circuit; and
an imaging device coupled to said processor circuit and comprising a pixel array, and said pixel array comprising,
a main recess,
at least one surface tension breaking feature arranged at an edge of the main recess, wherein the at least one surface tension breaking feature comprises a trench, wherein the trench has a surface interposed between first and second edges, wherein the first edge is closer to the main recess than the second edge, and wherein the second edge is defined by a wall that extends above the surface, and
a color filter array arranged in the main recess.

22. The imaging system of claim 21, wherein the at least one tension breaking feature further comprises an additional wall separating the trench from the main recess.

23. An imaging system comprising: a processor circuit; and
an imaging device coupled to said processor circuit and comprising a pixel array, and said pixel array comprising,
a main recess,
at least one surface tension breaking feature arranged at an edge of the main recess, and
a color filter array arranged in the main recess, wherein the main recess is arranged in a stack comprising a first material, a second material arranged on the first material, and a third material arranged on the second material and wherein at least one tension breaking feature comprises a trench arranged in the third material and a recess arranged in the first material.

24. The imaging system of claim 21, wherein the main recess is arranged in a stack comprising a substrate, a first material arranged on the substrate, and a second material arranged on the first material and wherein the wall and the trench are arranged in the second material.

* * * * *